US012757391B2

(12) United States Patent
Fulford et al.

(10) Patent No.: US 12,757,391 B2
(45) Date of Patent: Oct. 6, 2026

(54) 3D SEMICONDUCTOR DEVICE AND METHOD OF FORMING THE SAME

(71) Applicant: Tokyo Electron Limited, Tokyo (JP)

(72) Inventors: H. Jim Fulford, Albany, NY (US); Mark I. Gardner, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 1164 days.

(21) Appl. No.: 17/546,785

(22) Filed: Dec. 9, 2021

(65) Prior Publication Data

US 2023/0189514 A1 Jun. 15, 2023

(51) Int. Cl.

| | |
|---|---|
| ***H10B 41/27*** | (2023.01) |
| ***H10D 30/67*** | (2025.01) |
| ***H10D 84/03*** | (2025.01) |
| ***H10D 88/00*** | (2026.01) |

(52) U.S. Cl.

CPC ......... *H10B 41/27* (2023.02); *H10D 30/6757* (2025.01); *H10D 84/038* (2025.01); *H10D 88/00* (2025.01); *H10D 88/01* (2025.01)

(58) Field of Classification Search

CPC .. H10B 41/27; H10D 30/6757; H10D 84/038; H10D 88/00; H10D 88/01; H10D 30/6728; H10D 30/477; H10D 64/017; H10D 64/252; H10D 62/117; H10D 62/292; H10D 62/80; H10D 84/0167; H10D 84/0186; H10D 84/02; H10D 84/0149; H10D 84/016; H10D 84/0128; H10D 84/0195; H10D 84/85; H10D 89/10

See application file for complete search history.

(56) References Cited

U.S. PATENT DOCUMENTS

| | | | | |
|---|---|---|---|---|
| 7,910,982 | B2 * | 3/2011 | Oyu | H10B 10/00 257/E27.046 |
| 2017/0005106 | A1 * | 1/2017 | Zhang | H10D 30/693 |
| 2020/0020812 | A1 * | 1/2020 | Masuoka | H10D 30/025 |
| 2022/0359294 | A1 * | 11/2022 | Gardner | H10D 88/00 |

* cited by examiner

*Primary Examiner* — Allison Bernstein

(74) *Attorney, Agent, or Firm* — Oblon, McClelland, Maier & Neustadt, L.L.P.

(57) ABSTRACT

A semiconductor device includes a stack of layers, a vertical channel structure and vertical contact structures. The stack of layers defines a sidewall surface and includes terminal layers which include source, gate and drain layers. The vertical channel structure defines an inner axis that is substantially transverse to a main surface of the stack of layers. The vertical contact structures are each configured to electrically connect to a respective terminal layer. At least two vertical contact structures are in different radial positions relative to the inner axis.

20 Claims, 17 Drawing Sheets

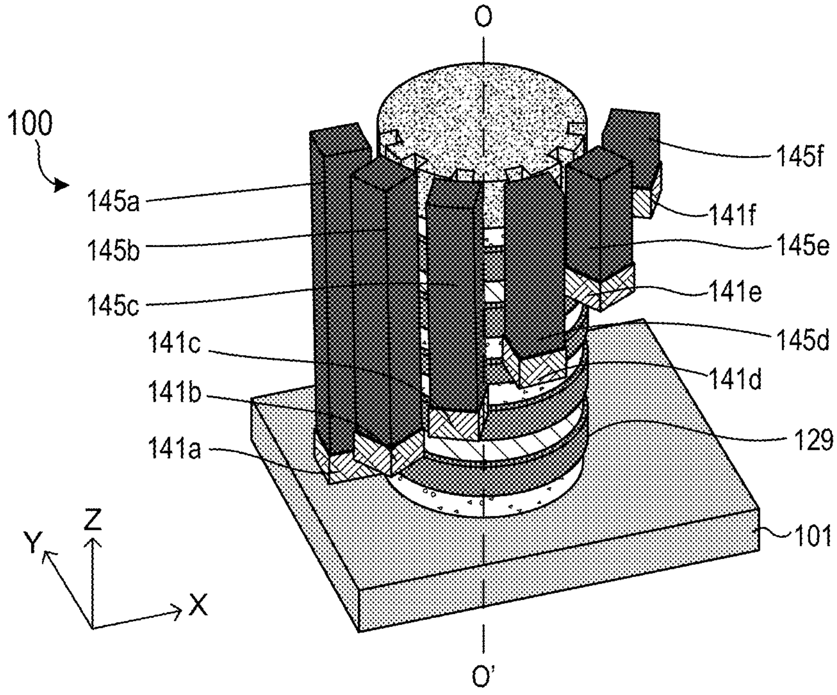
Figure 1A
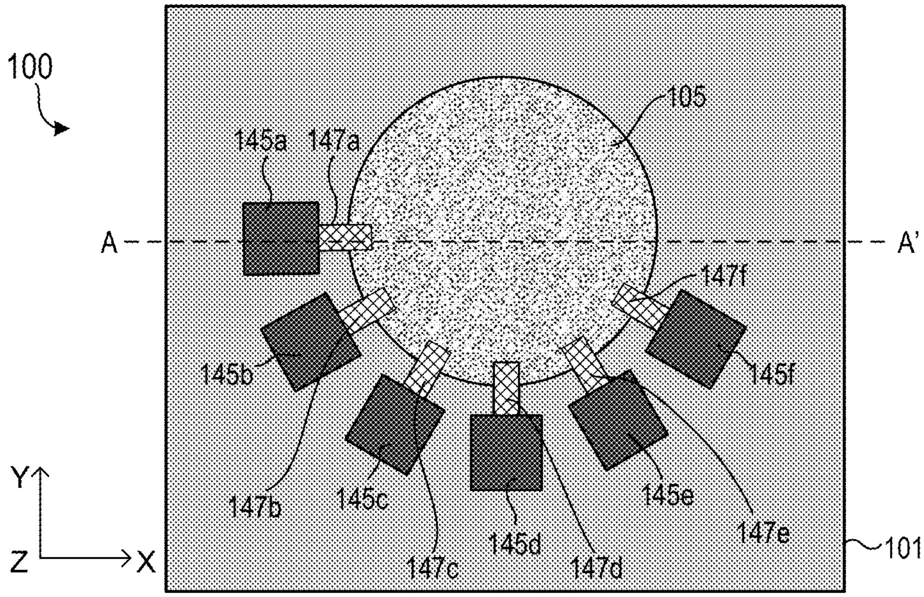
Fligure 1B

3D SEMICONDUCTOR DEVICE AND METHOD OF FORMING THE SAME

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of fabricating the same.

Aspect (1) includes a semiconductor device. The semiconductor device includes a stack of layers, a vertical channel structure and vertical contact structures. The stack of layers defines a sidewall surface and includes terminal layers which include source, gate and drain layers. The vertical channel structure defines an inner axis that is substantially transverse to a main surface of the stack of layers. The vertical contact structures are each configured to electrically connect to a respective terminal layer. At least two vertical contact structures are in different radial positions relative to the inner axis.

Aspect (2) includes the semiconductor device of aspect (1), wherein at least one vertical contact structure is positioned outside the stack of layers.

Aspect (3) includes the semiconductor device of aspect (2), further including a landing pad structure extending from the stack of layers outward to the at least one vertical contact structure. The landing pad structure is configured to electrically connect the at least one vertical contact structure to a respective terminal layer.

Aspect (4) includes the semiconductor device of aspect (3), wherein the at least one vertical contact structure is partially positioned on the landing pad structure and partially bypasses the landing pad structure in a direction of the inner axis.

Aspect (5) includes the semiconductor device of aspect (4), wherein at least two vertical contact structures have a same length in the direction of the inner axis. The at least two respective landing pad structures are in different radial positions and different longitudinal positions relative to the inner axis.

Aspect (6) includes the semiconductor device of aspect (3), wherein the at least one vertical contact structure is positioned on the landing pad structure.

Aspect (7) includes the semiconductor device of aspect (1), wherein at least one vertical contact structure partially extends through the stack of layers.

Aspect (8) includes the semiconductor device of aspect (7), wherein the at least one vertical contact structure includes a bottom surface in direct contact with a terminal layer.

Aspect (9) includes the semiconductor device of aspect (8), further including a dielectric shell surrounding a side surface of the at least one vertical contact structure.

Aspect (10) includes the semiconductor device of aspect (1), further including at least one vertical contact structure which extends along the inner axis and is configured to electrically connect to a topmost terminal layer.

Aspect (11) includes the semiconductor device of aspect (1), further including an interconnection structure configured to electrically connect a terminal layer of the stack of layers to another terminal layer of another stack of layers.

Aspect (12) includes the semiconductor device of aspect (11), wherein the interconnection structure extends outward from the stack of layers and extends outward from the another stack of layers.

Aspect (13) includes the semiconductor device of aspect (11), wherein at least one vertical contact structure is positioned on the interconnection structure.

Aspect (14) includes the semiconductor device of aspect (1), wherein at least two vertical contact structures are in a same radial position relative to the inner axis.

Aspect (15) includes the semiconductor device of aspect (1), wherein at least two vertical contact structures have a same distance from the inner axis.

Aspect (16) includes the semiconductor device of aspect (1), wherein at least two vertical contact structures have different distances from the inner axis.

Aspect (17) includes the semiconductor device of aspect (1), wherein the vertical channel structure includes a semiconductor shell surrounding a dielectric core.

Aspect (18) includes the semiconductor device of aspect (1), wherein the vertical channel structure extends from a source layer, through a gate layer, to a drain layer.

Aspect (19) includes the semiconductor device of aspect (1), wherein the vertical channel structure is configured to include a source region, a channel region and a drain region serially connected in a direction of the inner axis and have a current flow path in the direction of the inner axis.

Aspect (20) includes the semiconductor device of aspect (1), wherein a portion of the vertical channel structure is surrounded by a gate layer.

Aspect (21) includes the semiconductor device of aspect (1), wherein at least two vertical channel structures are separated from each other by a dielectric material.

Aspect (22) includes the semiconductor device of aspect (1), wherein the vertical channel structure has a circular, elliptical or polygonal shape in a plane parallel to the main surface of the stack of layers.

Aspect (23) includes the semiconductor device of aspect (1), wherein the stack of layers includes alternating dielectric layers and the terminal layers.

Aspect (24) includes the semiconductor device of aspect (1), wherein the sidewall surface of the stack of layers has a circular, elliptical or polygonal shape in a plane parallel to the main surface of the stack of layers.

Aspect (25) includes the semiconductor device of aspect (1), further including a bottom semiconductor layer positioned below the stack of layers.

Aspect (26) includes a method of microfabrication. The method includes forming a stack of layers which define a sidewall surface. The stack of layers includes terminal layers which include source, gate and drain layers. A vertical channel structure is formed which defines an inner axis that is substantially transverse to a main surface of the stack of layers. Vertical contact structures are formed, each of which is configured to electrically connect to a respective terminal layer. At least two vertical contact structures are formed in different radial positions relative to the inner axis.

Aspect (27) includes the method of aspect (26), wherein the forming the stack of layers includes forming an initial stack of layers that includes dielectric layers and sacrificial layers. The initial stack of layers is directionally etched to define an initial sidewall surface and expose the sacrificial layers from the initial sidewall surface. The sacrificial layers are replaced with the terminal layers.

Aspect (28) includes the method of aspect (27), wherein the forming the vertical channel structure includes forming a first hole that extends through the initial stack of layers. Semiconductor layers are formed in the first hole. The semiconductor layers include alternating replacement layers and channel layers. A second hole is formed that extends through the semiconductor layers. The replacement layers are removed via the second hole. The second hole is filled with a dielectric material.

Aspect (29) includes the method of aspect (28), further including forming the semiconductor layers by epitaxial growth.

Aspect (30) includes the method of aspect (29), further including forming the initial stack of layers over a bottom semiconductor layer so that the semiconductor layers are epitaxially grown on the bottom semiconductor layer.

Aspect (31) includes the method of aspect (28), further including forming the semiconductor layers so that each channel layer is in direct contact with a respective source layer, a respective gate layer and a respective drain layer.

Aspect (32) includes the method of aspect (28), further including filling the second hole with the dielectric material so that each remaining portion of a respective channel layer surrounds a respective dielectric core to form a respective vertical channel structure, and remaining portions of the channel layers are separated from each other by the dielectric material.

Aspect (33) includes the method of aspect (26), wherein the forming the vertical contact structures includes forming a landing pad structure that extends outward from the stack of layers. The landing pad structure is configured to electrically connect to a terminal layer.

Aspect (34) includes the method of aspect (33), further including forming at least two landing pad structures in different radial positions and different longitudinal positions relative to the inner axis. At least two vertical contact structures are formed, each of which is partially positioned above a respective landing pad structure and partially bypasses the respective landing pad structure in a direction of the inner axis. The at least two vertical contact structures have a same length in the direction of the inner axis.

Aspect (35) includes the method of aspect (34), further including simultaneously forming at least two holes each having a shallow portion exposing a respective landing pad structure and a deep portion bypassing the respective landing pad structure so that the at least two holes have a same depth. The at least two holes are filled with a conductive material to form the at least two vertical contact structures.

Aspect (36) includes the method of aspect (33), further including forming a vertical contact structure on the landing pad structure.

Aspect (37) includes the method of aspect (26), further including directionally etching at least partially through the stack of layers to form a hole and expose a terminal layer. A dielectric shell and a vertical contact structure are formed in the hole so that the vertical contact structure is surrounded by the dielectric shell and is in direct contact with the terminal layer.

Aspect (38) includes the method of aspect (26), further including forming a vertical contact structure that extends along the inner axis and is configured to electrically connect to a topmost terminal layer.

Aspect (39) includes the method of aspect (26), further including forming at least two vertical contact structures in a same radial position relative to the inner axis.

Aspect (40) includes the method of aspect (26), further including forming an interconnection structure that is configured to electrically connect a terminal layer of the stack of layers to another terminal layer of another stack of layers.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a perspective view of a semiconductor device in accordance with one embodiment of the present disclosure.

FIG. 1B shows a top view of the semiconductor device in FIG. 1A, in accordance with one embodiment of the present disclosure.

FIGS. 8B', 8D' and 8E' show perspective views of the semiconductor device in FIGS. 8B, 8D and 8E respectively, in accordance with exemplary embodiments of the present disclosure.

DETAILED DESCRIPTION

Figure 1C:
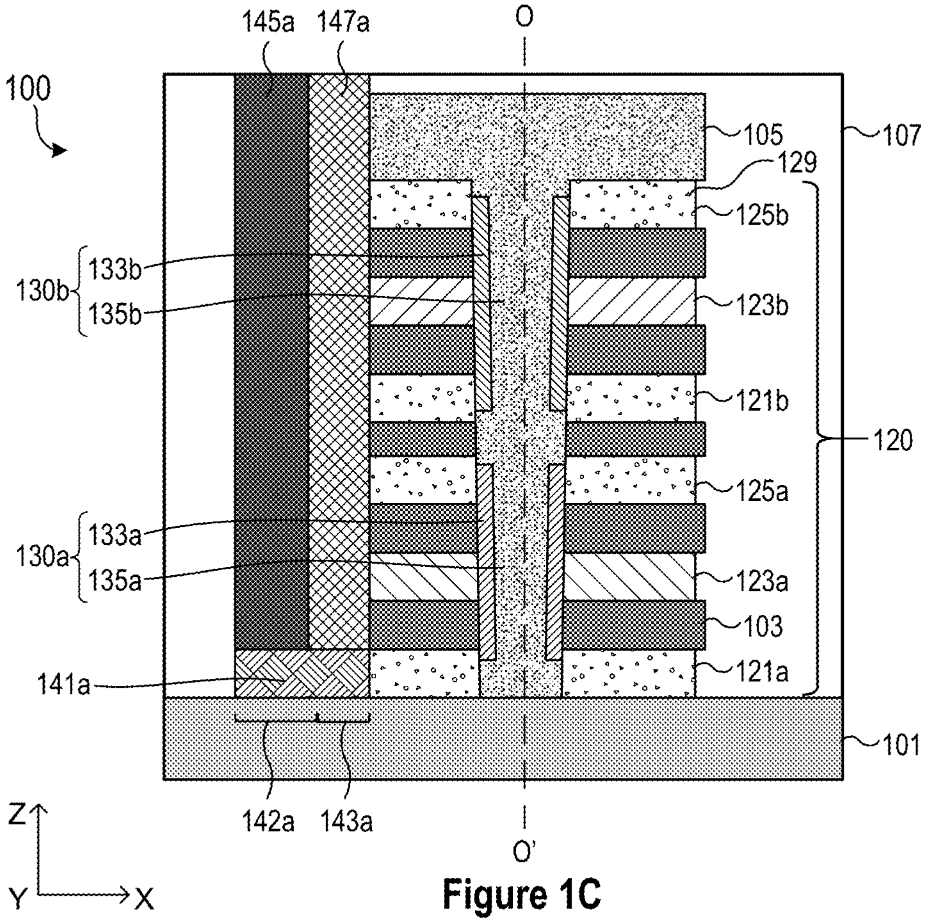
FIG. 1C shows a vertical cross-sectional view taken along the line cut AA' in FIG. 1B, in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, 3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g. CPU (central processing unit), GPU (graphics processing unit), FPGA (field programmable gate array, SoC (System on a chip), etc.) is being pursued.

Techniques herein include methods for building devices vertically to improve the area and 3D stacking/construction using epitaxially grown materials with in-situ stack, and to enhance vertical routing density of the source, gate and drain connections of the 3D stack of transistors using various radial positions (360 degrees available) of the in-situ stack. For example, vertical cylindrical transistors can be built to enable compact 360-degree vertical wiring connections of source, gate and drain regions for N transistors tall. The number of mask steps can be reduced by a vertical 360-degree process flow, relative to horizontal 3D devices and 2D devices. For example, one embodiment includes making final hookup of all metal lines from top with hard mask in place in one process step for CFET devices for N CFET devices. That is, a single etching process can be executed to make the source, gate and drain connections for multiple devices.

Techniques herein include 3D vertical transistors made with a stack of layers having source, gate and drain layers extending in a horizontal direction and vertical channel structures extending in a vertical direction. The stack of layers defines a sidewall surface while the vertical channel structures define an inner axis in the vertical direction. Vertical contact structures can be formed that are configured to electrically connect to the source, gate and drain layers. The vertical contact structures can be placed outside the stack of layers and electrically connected to the source, gate and drain layers via horizontal landing pad structures. Alternatively, the vertical contact structures can partially extend through the stack of layers (i.e. at least partially inside the stack of layers) and each be in direct contact with a respective source, gate or drain layer.

According to aspects of the disclosure, because the vertical channel structures are surrounded by the source, gate and drain layers, the vertical contact structures herein have 360-degree access. That is, a given vertical contact structure can be placed at any radial position relative to the inner axis. In one embodiment, at least two vertical contact structures are in different radial positions relative to the inner axis. In another embodiment, at least two vertical contact structures are in a same radial position relative to the inner axis. Further, in yet another embodiment, a vertical contact structure may extend along the inner axis and is configured to electrically connect to a topmost terminal layer. In other words, the vertical contact structure is not in any radial position, but overlaps with the inner axis.

Techniques herein include 3D vertical transistors made with at least two stacks of layers. Each stack of layers includes respective source, gate and drain layers extending in a horizontal direction and vertical channel structures extending in a vertical direction. An interconnection structure can be formed that is configured to electrically connect a source, gate or drain layer of one stack to another source, gate or drain layer of another stack. A common vertical contact structure may be formed on the interconnection structure.

FIG. 1A shows a perspective view of a semiconductor device 100 in accordance with one embodiment of the present disclosure. FIG. 1B shows a top view of the semiconductor device 100 in FIG. 1A, in accordance with one embodiment of the present disclosure. FIG. 1C shows a vertical cross-sectional view taken along the line cut AA' in FIG. 1B, in accordance with one embodiment of the present disclosure.

As shown, the semiconductor device 100 includes a stack 120 of layers defining a sidewall surface 129. The stack 120 of layers includes terminal layers which include source layers and drain layers (also referred to as S/D layers or terminal layers, e.g. 121*a*, 125*a*, 121*b* and 125*b*) and gate layers (also referred to as terminal layers, e.g. 123*a* and 123*b*). The semiconductor device 100 also includes vertical channel structures (e.g. 130*a* and 130*b*) defining an inner axis OO' that is substantially transverse to a main surface (e.g. the XY plane) of the stack 120 of layers. The semiconductor device 100 further includes vertical contact structures (e.g. 145*a*, 145*b*, 145*c*, 145*d*, 145*e* and 145*f*). Each vertical contact structure (e.g. 145*a*) can be configured to electrically connect to a respective terminal layer (e.g. 121*a*).

As illustrated in FIG. 1C, the stack 120 of layers includes dielectric layers 103 and the terminal layers stacked alternatingly over each other. The terminal layers can be configured to electrically connect to source, gate and drain regions (not shown) of the vertical channel structures 130*a* and 130*b* and therefore function as source, gate and drain terminals of corresponding vertical transistors. For example, the terminal layers can be conductive and include one or more metal materials. Specifically, the S/D layers 121*a*, 125*a*, 121*b* and 125*b* can include a same conductive material or different conductive materials. While not shown, the gate layers 123*a* and 123*b* can each include one or more work function metals (WFMs) and one or more high-k dielectrics, with the one or more high-k dielectrics sandwiched between the one or more WFMs and a corresponding vertical channel structure (130*a* or 130*b*). Further, the terminal layers are electrically isolated from each other by the dielectric layers 103. In this example, the sidewall surface 129 has a staggered profile. The dielectric layers 103 have larger dimensions than the terminals layers in the XY plane. As a result, the dielectric layers 103 may appear to "protrude", and the terminal layers may appear to be "recessed". In another example (not shown), the sidewall surface 129 can have a flat or smooth profile. The dielectric layers 103 and the terminals layers may have identical dimensions in the XY plane. It should be understood that chemical composition of the dielectric layers 103 may vary, depending on the (neighboring) terminal layers.

In some embodiments, the stack 120 of layers is positioned on a bottom semiconductor layer 101. The bottom semiconductor layer 101 can be positioned over an insulator disposed on a substrate (not shown). That is, the bottom semiconductor layer 101 is epitaxially grown on a substrate having a dielectric layer disposed thereon, thus forming an SOI (silicon-on-insulator), a GeOI (Germanium-on-insulator), an SGOI (SiGe-on-insulator) or the like. In some embodiments, the bottom semiconductor layer 101 can include completed devices with isolated silicon on top. In some embodiments, the bottom semiconductor layer 101 includes single crystal silicon at a top surface of the bottom semiconductor layer 101. In some embodiments, an additional dielectric layer (not shown) may be positioned between the S/D layer 121*a* and the bottom semiconductor layer 101. In addition, a capping layer 105 may be positioned over the stack 120 of layers and can include a hard mask material. An insulating layer 107 may surround and be positioned over the stack 120 of layers. Note that the insulating layer 107 is not shown in FIG. 1B and other top views for illustrative purposes. The dielectric shells 147*a*-147*f* (and other similar dielectric shells) are not shown in FIG. 1A, in addition to other 3D views or top views for illustrative purposes.

As demonstrated in FIG. 1C, the vertical channel structure 130*a* includes a semiconductor shell 133*a* surrounding a dielectric core 135*a*. The vertical channel structure 130*a* extends from the (bottom) S/D layer 121*a*, through the gate layer 123*a*, to the (top) S/D layer 125*a*. While not shown, the semiconductor shell 133*a* of the vertical channel structure 130*a* is configured to include a bottom S/D region, a channel region and a top S/D region serially connected in a direction (e.g. the Z direction) of the inner axis OO' and have a current flow path in the direction of the inner axis. The bottom S/D region is in direct contact with the (bottom) S/D layer 121*a*. The channel region is in direct contact with the gate layer 123*a*. The top S/D region is in direct contact with the (top) S/D layer 125*a*. Further, a portion of the vertical channel structure 133*a*, e.g. the channel region, is surrounded by the gate layer 123*a*. Therefore, the vertical channel structure 130*a* and the terminal layers 121*a*, 123*a* and 125*a* can be configured as a vertical gate-all-around (GAA) transistor.

Note that the vertical channel structure 130*b* is similar to the vertical channel structure 130*a*. Moreover, the vertical channel structures 130*a* and 130*b* are co-axial, meaning that the vertical channel structures 130*a* and 130*b* define a common inner axis: the inner axis OO'. In this example, dielectric cores 135*a* and 135*b* and the capping layer 105 include a same dielectric material that also separates the vertical channel structures 130*a* and 130*b* from each other as well as separates the vertical channel structure 130*a* from the bottom semiconductor layer 101.

While not shown, the vertical channel structures 130*a* and 130*b* can have a circular, elliptical, polygonal or any irregular shape in a plane (e.g. the XY plane) parallel to the main surface of the stack 120 of layers. Particularly, the dielectric cores 135*a* and 135*b* can have a circular, elliptical, polygonal or any irregular shape in the XY plane. Similarly, the sidewall surface 129 may have a circular, elliptical, polygonal or any irregular shape in the plane parallel to the main surface of the stack 120 of layers. In the examples of FIGS. 1A-1C, the sidewall surface 129 and the vertical channel structures 130*a* and 130*b* have circular shapes in the XY plane and are co-axial. That is, the inner axis OO' is also a central axis of the stack 120. It should understood that the inner axis OO' and the vertical channel structures 130*a* and 130*b* can be placed within the stack 120 in other positions as well.

Regardless of shapes of the sidewall surface 129 and the vertical channel structures 130*a* and 130*b* as well as positions of the vertical channel structures 130*a* and 130*b* relative to the stack 120, the vertical contact structures 145*a*-145*f* can have 360-degree access to the terminal layers. In other words, the vertical contact structures 145*a*-145*f* can be placed in any radial positions (or radial directions) relative to the inner axis OO' while being configured to electrically connect to respective terminal layers. For instance, the vertical contact structure 145*a* is electrically connected to the S/D layer 121*a* via a landing pad structure 141*a*. Because the vertical contact structure 145*a* is positioned outside, or spaced apart from, the stack 120 of layers, the landing pad structure 141*a* extends from the stack 120 of layers outward to the vertical contact structure 145*a*. The landing pad structure 141*a* is conductive and can, for example, include a metal material.

Further, the landing pad structure 141*a* can include a pad portion 142*a* and an extension portion 143*a*. The vertical contact structure 145*a* can be positioned on the pad portion 142*a* while a dielectric isolation structure 147*a* can be positioned on the extension portion 143*a*. The dielectric isolation structure 147*a* electrically isolates the vertical contact structure 145*a* from the stack 120. Note that the extension portion 143*a* extends from the stack 120 outward so the dielectric isolation structure 147*a* partially extends through the stack 120. In some embodiments, the pad portion 142*a* is wider than the extension portion 143*a* in a direction that is tangent to a radial direction (or radial position) of the vertical contact structure 145*a*. The extension portion 143*a* can be designed to be relatively small with minimum dimensions for improving a current carrying capacity, CD limits, etc., whereas the pad portion 142*a* can be designed to be relatively large so that a deep etching process can stop or "land" on the pad portion 142*a*. While the vertical contact structure 145*a* is as large as the pad portion 142*a* in this example, the vertical contact structure 145*a* can be designed to be smaller than the pad portion 142*a* in order to have a larger operation window for a corresponding deep etching process in other examples.

Similarly, the vertical contact structures 145*b*, 145*c*, 145*d*, 145*e* and 145*f* can be electrically connected to the terminal layers 123*a*, 125*a*, 121*b*, 123*b*, 125*b* via landing pad structures 141*b*, 141*c*, 141*c*, 141*d*, 141*e* and 141*f* respectively. In the examples of FIGS. 1A-1C, the vertical contact structures 145*a*-145*f* have a spiral staircase design. That is, the vertical contact structures 145*a*-145*f* have a same distance from the inner axis OO' and different radial positions relative to the inner axis OO'. Lengths of the vertical contact structures 145*a*-145*f* in the Z direction are arranged in descending order.

In a non-limiting example, the bottom semiconductor layer 101 includes silicon (Si). The semiconductor shells 133*a* and 133*b* include n-type Si and p-type Si respectively. The S/D layers 121*a*, 125*a*, 121*b* and 125*b* are metallic. The gate layers 123*a* and 123*b* each include a respective WFM and a respective high-k dielectric. The dielectric layers 103, the insulating layer 107 and dielectric isolation structures 147*a*-147*f* include silicon oxide. The capping layer 105 and the dielectric cores 135*a* and 135*b* include silicon nitride or silicon oxynitride. The landing pad structures 141*a*-141*f* and the vertical contact structures 145*a*-145*f* are metallic. Note that in some embodiments, the semiconductor shells 133*a* and 133*b* can include one or more 2D semiconductor materials, such as a metal chalcogenide, a carbon-based material (e.g. graphene), a semiconducting oxide (e.g. ZnO, CdO or $In_2O_3$), hexagonal boron nitride (h-BN) or the like. For example, a metal chalcogenide may include at least one of $WS_2$, $WSe_2$, $WTe_2$, $MoS_2$, $MoSe_2$, $MoTe_2$, $HfS_2$, $ZrS_2$, $TiS_2$, GaSe, InSe, SnS, $TiS_3$ or the like.

As will be shown later in other examples, the vertical contact structures 145*a*-145*f* can have different configurations or placements relative to each other. In some embodiments, at least two of the vertical contact structures 145*a*-145*f* can have different distances from the inner axis OO'. In some embodiments, at least two of the vertical contact structures 145*a*-145*f* can have a same radial direction relative to the inner axis OO'. In some embodiments, lengths of the vertical contact structures 145*a*-145*f* in the Z direction can be arranged in any order.

Figure 2A:
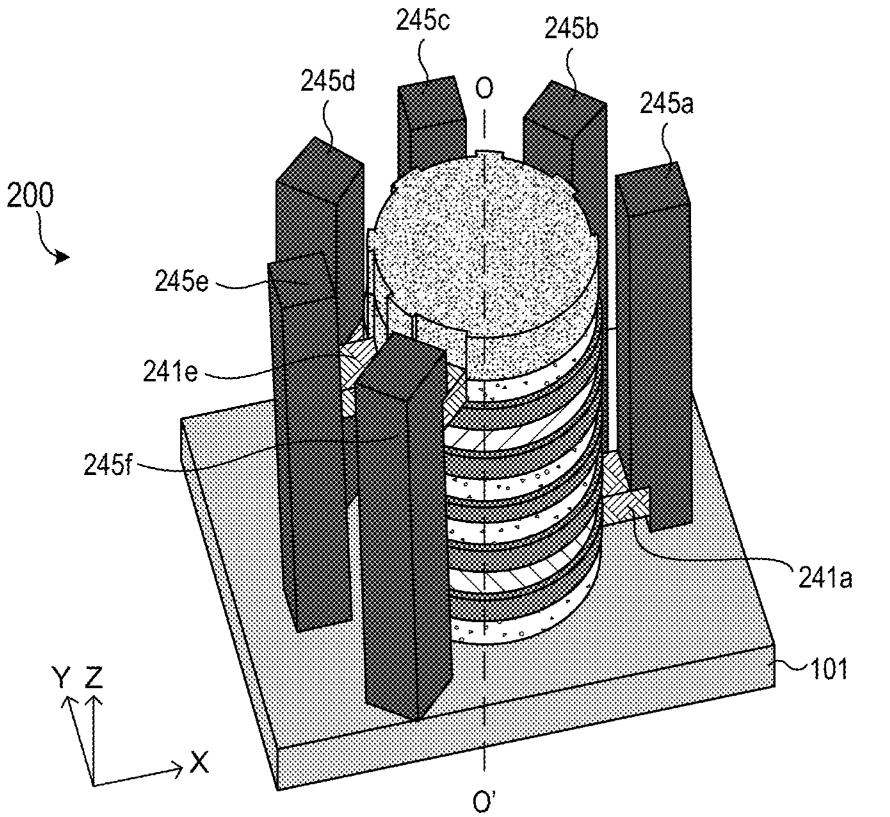
FIG. 2A shows a perspective view of a semiconductor device in accordance with another embodiment of the present disclosure.
Figure 2B:
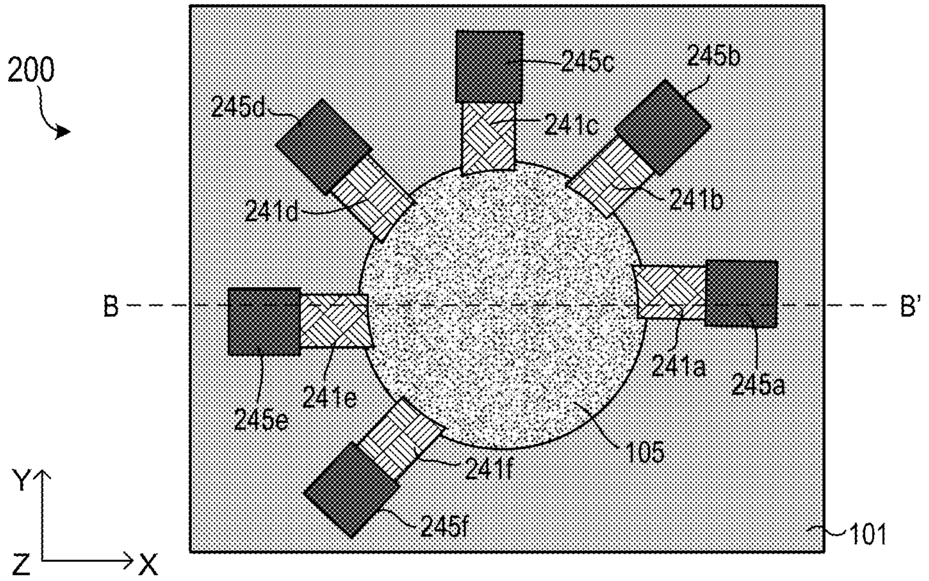
FIG. 2B shows a top view of the semiconductor device in FIG. 2A, in accordance with one embodiment of the present disclosure.
Figure 2C:
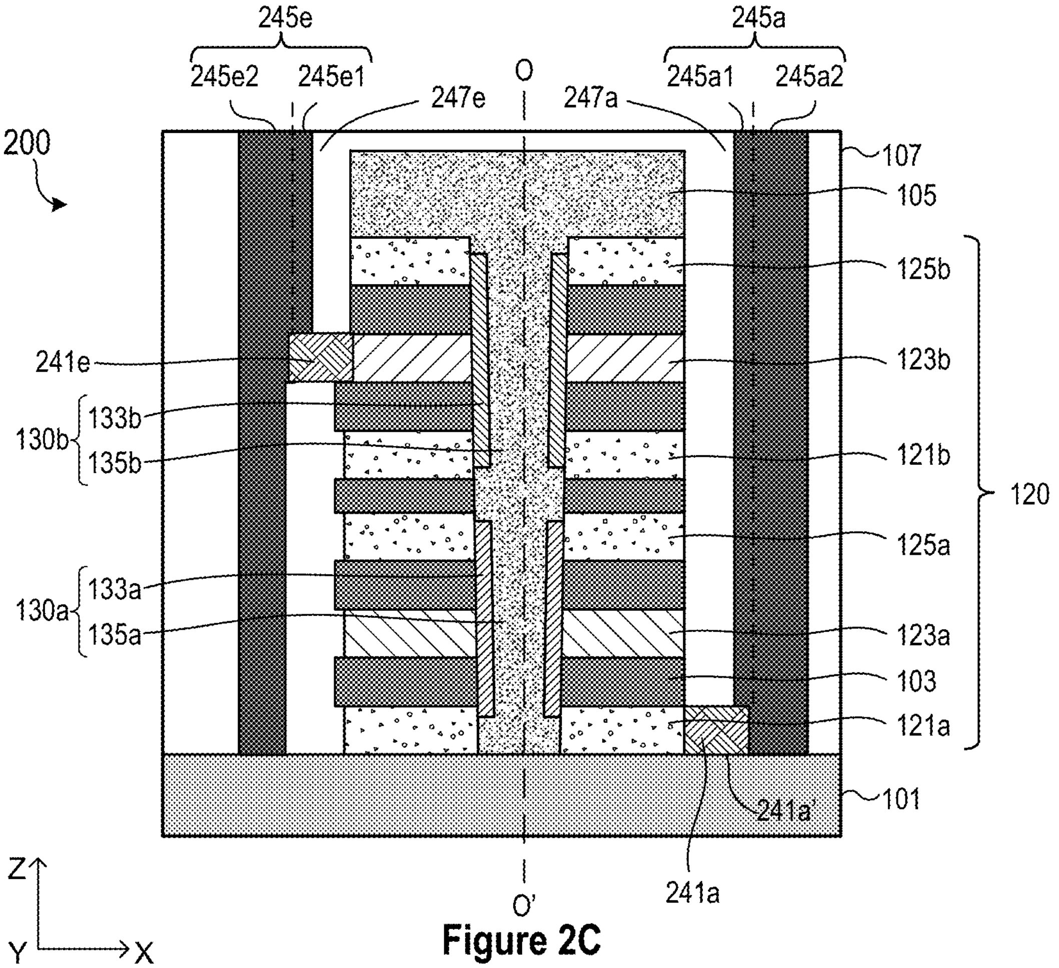
FIG. 2C shows a vertical cross-sectional view taken along the line cut BB' in FIG. 2B, in accordance with one embodiment of the present disclosure.

FIG. 2A shows a perspective view of a semiconductor device 200 in accordance with another embodiment of the present disclosure. FIG. 2B shows a top view of the semiconductor device 200 in FIG. 2A, in accordance with one embodiment of the present disclosure. FIG. 2C shows a vertical cross-sectional view taken along the line cut BB' in FIG. 2B, in accordance with one embodiment of the present disclosure. Since the embodiment of the semiconductor device 200 is similar to the embodiment of the semiconductor device 100, descriptions herein will be given with emphasis placed on differences.

As shown, the semiconductor device 200 includes vertical contact structures 245*a*, 245*b*, 245*c*, 245*d*, 245*e* and 245*f* and landing pad structures 241*a*, 241*b*, 241*c*, 241*d*, 241*e* and 241*f* The landing pad structures 241*a*-241*f* correspond to the landing pad structures 141*a*-141*f* and are in different radial positions relative to the inner axis OO'. The landing pad structures 241*a*-241*f* are also in different longitudinal positions relative to the inner axis OO'. That is, the landing pad structures 241*a*-241*f* have different vertical positions in the Z direction. Nevertheless, different from the vertical contact structures 145*a*-145*f*, the vertical contact structures 245*a*-245*f* have a same length in the direction of the inner axis OO'. That is, the vertical contact structures 245*a*-245*f* are equally long in the Z direction.

The vertical contact structures 245*a*-245*f* each are partially positioned on a respective landing pad structure and partially bypass the respective landing pad structure in the Z direction. For example, the vertical contact structure 245*e* includes a shallow portion 245*e*1 positioned on the landing pad structure 241*e* and a deep portion 245*e*2 bypassing the landing pad structure 241*e* in the Z direction. Shallow portions of the vertical contact structures 245*a*-245*f* have different lengths in the Z direction because the landing pad structures 241*a*-241*f* have different vertical positions. Nevertheless, deep portions of the vertical contact structures 245*a*-245*f* have a same length in the Z direction. Note that for the (bottommost) landing pad structure 241*a*, a deep portion 245*a*2 of the vertical contact structure 245*a* may or may not extend beyond a bottom surface 241*a*' of the landing pad structure 241*a*. Additionally, dielectric isolation structures (e.g. 247*a* and 247*e*) include a same material as the insulating material 107 in this example. While not shown, in some embodiments, the vertical contact structures (e.g. 245*e*) do not include the shallow portions (e.g. 245*e*1) positioned on the landing pad structures (e.g. 241*e*) and only contact side surfaces of the landing pad structures (e.g. 241*e*).

Figure 3A:
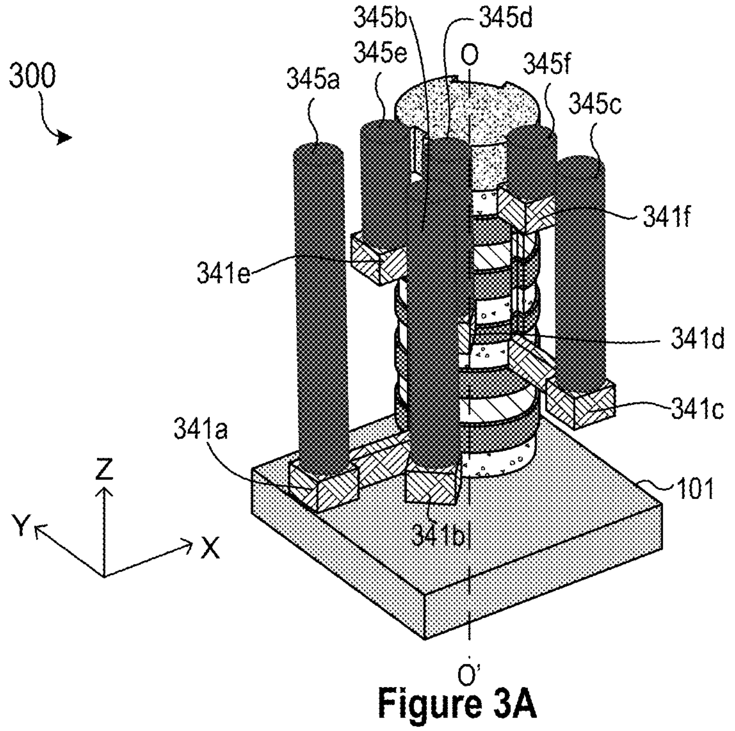
FIG. 3A shows a perspective view of a semiconductor device in accordance with yet another embodiment of the present disclosure.
Figure 3B:
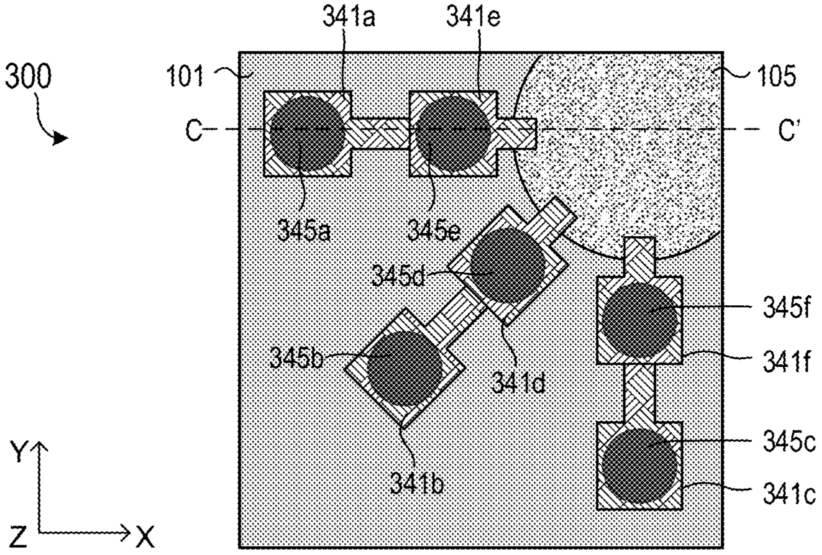
FIG. 3B shows a top view of the semiconductor device in FIG. 3A, in accordance with one embodiment of the present disclosure.
Figure 3C:
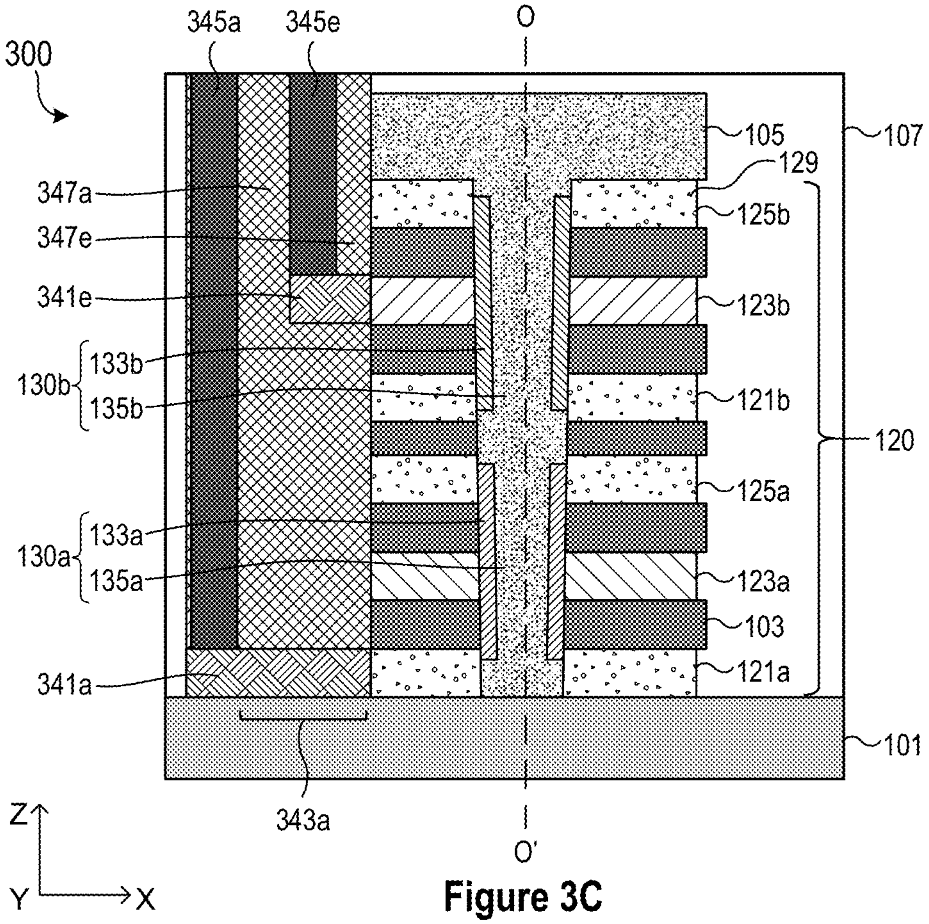
FIG. 3C shows a vertical cross-sectional view taken along the line cut CC' in FIG. 3B, in accordance with one embodiment of the present disclosure.

FIG. 3A shows a perspective view of a semiconductor device 300 in accordance with yet another embodiment of the present disclosure. FIG. 3B shows a top view of the semiconductor device 300 in FIG. 3A, in accordance with one embodiment of the present disclosure. FIG. 3C shows a vertical cross-sectional view taken along the line cut CC' in FIG. 3B, in accordance with one embodiment of the present disclosure. Since the embodiment of the semiconductor device 300 is similar to the embodiment of the semiconductor device 100, descriptions herein will be given with emphasis placed on differences.

As shown, the semiconductor device 300 includes vertical contact structures 345*a*, 345*b*, 345*c*, 345*d*, 345*e* and 345*f* and landing pad structures 341*a*, 341*b*, 341*c*, 341*d*, 341*e* and 341*f*. At least two of the landing pad structures 341*a*-341*f* are in a same radial position. Specifically, the landing pad structures 341_a_ and 341_e_ are both in a first radial position. Therefore, an extension portion 343_a_ of the landing pad structure 341_a_ is longer than the landing pad structure 341_e_ in the first radial position in order that the vertical contact structures 345_a_ and 345_e_ can be electrically isolated by a dielectric isolation structure 347_a_. Similarly, the landing pad structures 341_b_ and 341_d_ are both in a second radial position while the landing pad structures 341_c_ and 341_f_ are both in a third radial position.

Ergo, the vertical contact structures 345_a_-345_f_ correspond to the vertical contact structures 145_a_-145_f_, except that at least two of the vertical contact structures 345_a_-345_f_ are in a same radial direction while having different distances from the inner axis OO'. For example, the vertical contact structures 345_a_ and 345_e_ are both in the first radial position while the vertical contact structure 345_a_ is farther away from the inner axis OO' than the vertical contact structure 345_e_. Similarly, the vertical contact structures 345_b_ and 345_d_ are both in the second radial position while the vertical contact structures 345_c_ and 345_f_ are both in the third radial position. As a result, the vertical contact structures 345_a_-345_f_ have a double spiral staircase design with variable landing pad structures 341_a_-341_f_ Compact routing can be achieved with more radial space saved.

While not shown, in an alternative embodiment, the semiconductor device 300 may include at least one common vertical contact structure in lieu of two separate vertical contact structures (e.g. 345_a_ and 345_e_) in a same radial direction. The at least one common vertical contact structure can be similar to the vertical contact structures 245_a_-245_f_ in that the common vertical contact structure includes a shallow portion and a deep portion. For example, the shallow portion is positioned on the landing pad structure 341_e_ and can correspond to the vertical contact structure 345_e_. The deep portion bypasses the landing pad structure 341_e_ in the Z direction and extends to the landing pad structure 341_a_. By using such a common vertical contact structure, layers that are spaced apart from each other can be electrically coupled. For example, the gate layers 123_a_ and 123_b_ can be configured to receive a same control signal or voltage via a common vertical contact structure.

Figure 4A:
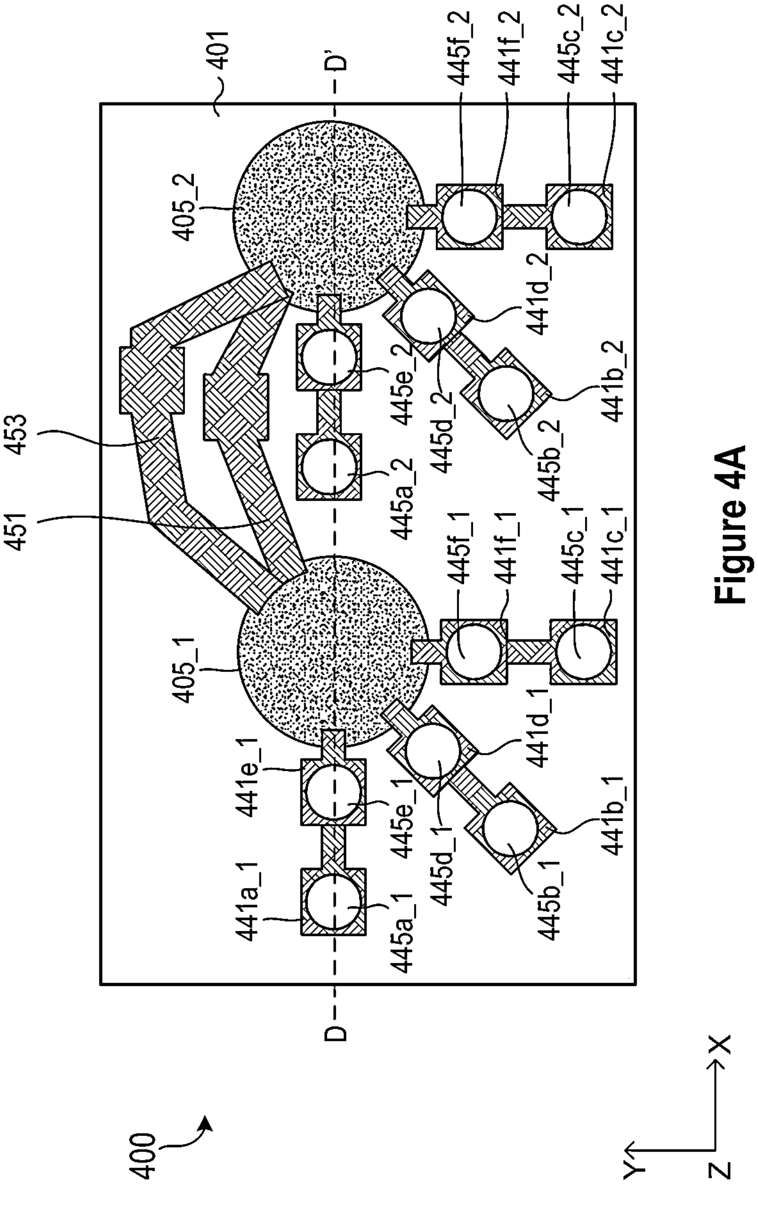
FIG. 4A shows a top view of a semiconductor device in accordance with yet another embodiment of the present disclosure.
Figure 4B:
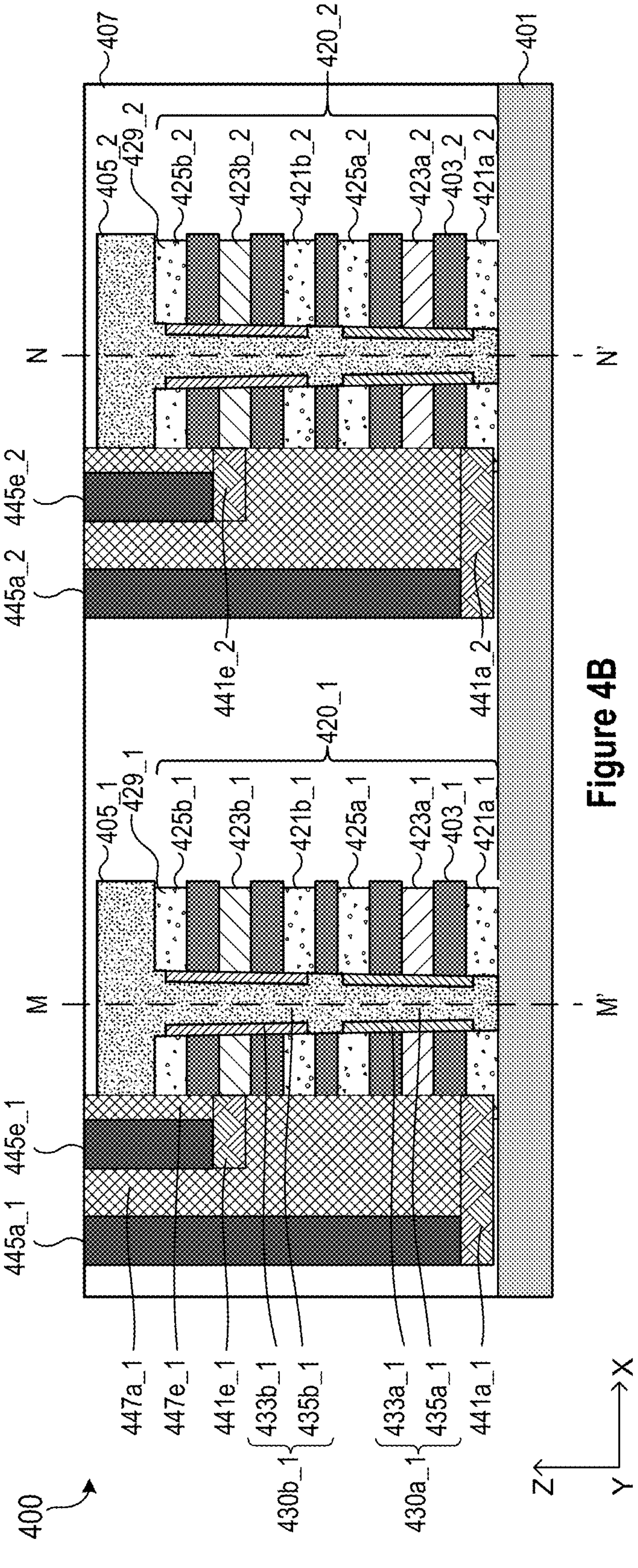
FIG. 4B shows a vertical cross-sectional view of taken along the line cut DD' in FIG. 4A, in accordance with one embodiment of the present disclosure.

FIG. 4A shows a top view of a semiconductor device 400 in accordance with yet another embodiment of the present disclosure. FIG. 4B shows a vertical cross-sectional view of taken along the line cut DD' in FIG. 4A, in accordance with one embodiment of the present disclosure. Since the embodiment of the semiconductor device 400 is similar to the embodiment of the semiconductor device 300, descriptions herein will be given with emphasis placed on differences.

As shown, the semiconductor device 400 includes a first stack 420_1 of layers and a second stack 420_2 of layers. The first stack 420_1 and the second stack 420_2 can each correspond to the stack 120 of layers. Take the first stack 420_1 for example; S/D layers 421_a__1, 425_a__1, 421_b__1 and 425_b__1 can respectively correspond to the S/D layers 121_a_, 125_a_, 121_b_ and 125_b_. Gate layers 423_a__1 and 423_b__1 can respectively correspond to the gate layers 123_a_ and 123_b_. Vertical channel structures 430_a__1 and 430_b__1 can respectively correspond to the vertical channel structures 130_a_ and 130_b_. Dielectric layers 403_1 can correspond to the dielectric layers 103. A capping layer 405_1 can correspond to the capping layer 105. A bottom semiconductor layer 401 can correspond to the bottom semiconductor layer 101. An insulating layer 407 can correspond to the insulating layer 107. Further, vertical contact structures 445_a__1, 445_b__1, 445_c__1, 445_d__1, 445_e__1 and 445_f__1 can respectively correspond to the vertical contact structures 345_a_, 345_b_, 345_c_, 345_d_, 345_e_ and 345_f_ Landing pad structures 441_a__1, 441_b__1, 441_c__1, 441_d__1, 441_e__1 and 441_f__1 can respectively correspond to the landing pad structures 341_a_, 341_b_, 341_c_, 341_d_, 341_e_ and 341_f_.

Further, the semiconductor device 400 includes one or more interconnection structures (e.g. 451 and 453). While not shown, each interconnection structure can be configured to electrically connect a first terminal layer of the first stack 420_1 to a second terminal layer of the second stack 420_2. For example, the interconnection structure 451 may electrically connect the gate layer 423_b__1 to a gate layer 423_b__2. As a result, the gate layers 423_b__1 and 423_b__2 are electrically coupled. In the examples of FIGS. 4A-4B, the gate layers 423_b__1 and 423_b__2 are electrically connected to vertical contact structures 445_e__1 and 445_e__2 respectively. In another example, the gate layers 423_b__1 and 423_b__2 may be electrically connected to a common vertical contact structure (not shown) that is positioned on the interconnection structure 451. Similarly, the interconnection structure 453 may electrically connect the S/D layer 421_a__1 to an S/D layer 421_a__2 or 421_b__1. Further, in some embodiments, at least one interconnection structure can also be configured to electrically connect two terminal layers within a same stack, such as the gate layers 423_a__1 and 423_b__1.

In one embodiment, the first stack 420_1 and the second stack 420_2 are adjacent to each other. In another embodiment, the first stack 420_1 and the second stack 420_2 are separated by at least one transistor structure. Accordingly, the one or more interconnection structures may bypass the at least one transistor structure. Further, the one or more interconnection structures can be implemented between transistor devices at various hierarchical levels to make a complete circuit. Advantages of such a hierarchical design can be exercised to interconnect nodes placed on a same horizontal level while being separated by different vertical planes.

Note that in the examples of FIGS. 4A-4B, the embodiment of the semiconductor device 400 is similar to the embodiment of the semiconductor device 300. That is, the vertical contact structures 445_a__1, 445_b__1, 445_c__1, 445_d__1, 445_e__1 and 445_f__1 have a double spiral staircase design. In other examples (not shown), the vertical contact structures 445_a__1, 445_b__1, 445_c__1, 445_d__1, 445_e__1 and 445_f__1 may have any other configurations or arrangements. Similarly, vertical contact structures 445_a__2, 445_b__2, 445_c__2, 445_d__2, 445_e__2 and 445_f__2 may independently have any other configurations or arrangements.

Figure 5A:
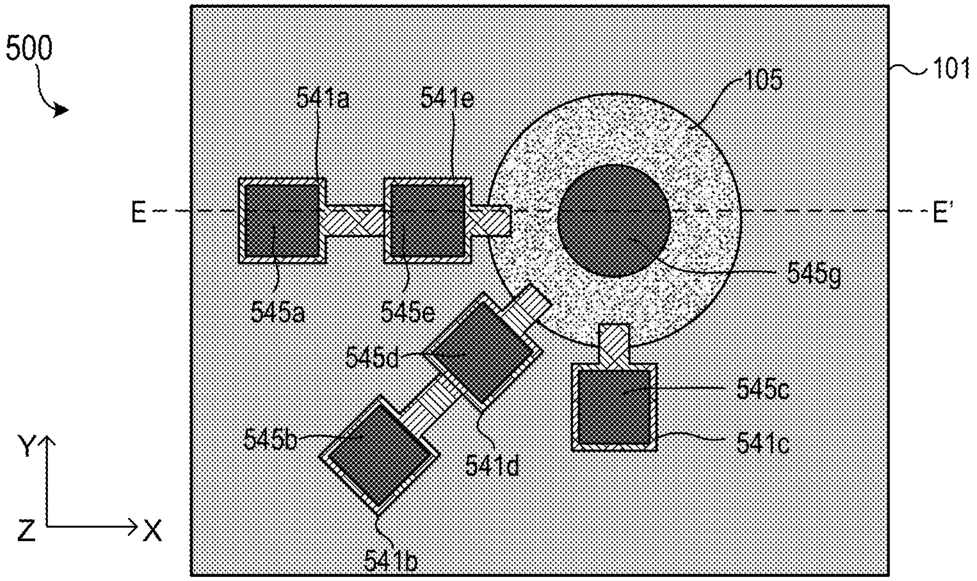
FIG. 5A shows a top view of a semiconductor device in accordance with yet another embodiment of the present disclosure.
Figure 5B:
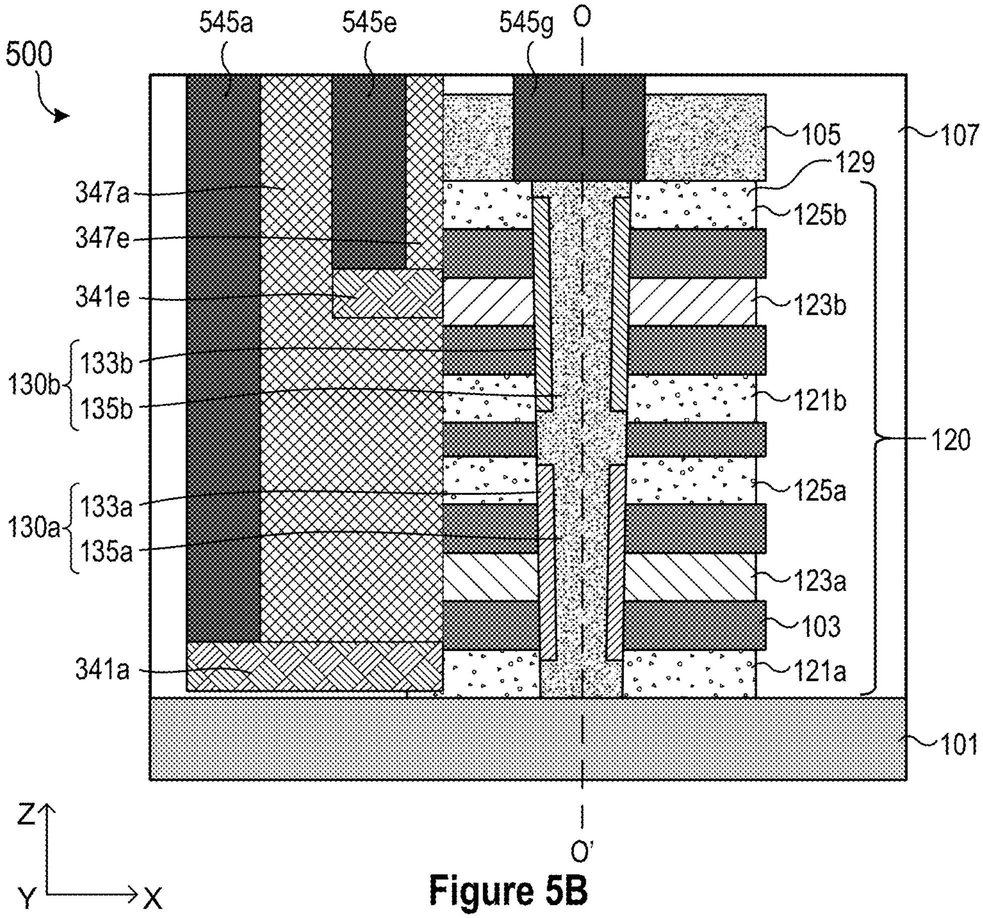
FIG. 5B shows a vertical cross-sectional view of taken along the line cut EE' in FIG. 5A, in accordance with one embodiment of the present disclosure.

FIG. 5A shows a top view of a semiconductor device 500 in accordance with yet another embodiment of the present disclosure. FIG. 5B shows a vertical cross-sectional view of taken along the line cut EE' in FIG. 5A, in accordance with one embodiment of the present disclosure. Since the embodiment of the semiconductor device 500 is similar to the embodiment of the semiconductor device 300, descriptions herein will be given with emphasis placed on differences.

As shown, the semiconductor device 500 includes vertical contact structures 545_a_, 545_b_, 545_c_, 545_d_ and 545_e_ and landing pad structures 541_a_, 541_b_, 541_c_, 541_d_ and 541_e_. The vertical contact structures 545_a_-545_e_ correspond to the vertical contact structures 345_a_-345_e_. The landing pad structures 541_a_-541_e_ correspond to the landing pad structures 341_a_-341_e_.

Further, the semiconductor device 500 includes a vertical contact structure 545_g_ which extends along the inner axis OO' and is configured to electrically connect to a topmost terminal layer, i.e. the S/D layer 125*b* in this example. Note that the vertical contact structure 545*g* is not placed in any radial position relative to the inner axis OO', but overlaps with the inner axis OO'. Therefore, the vertical contact structure 545*g* can be in direct contact with and electrically connected to the S/D layer 125*b*. Additionally, the vertical contact structure 545*g* is positioned above and spaced apart from the vertical channel structure 130*b*.

In the examples of FIGS. 5A-5B, the vertical contact structures 545*a*-545*e* have a similar double spiral staircase design to the vertical contact structures 345*a*-345*e*. In other examples, the vertical contact structures 545*a*-545*e* may have any other configurations or arrangements. In one example (not shown), the vertical contact structures 545*a*-545*e* may have a similar spiral staircase design to the vertical contact structures 145*a*-145*e*. In another example (not shown), the vertical contact structures 545*a*-545*e* may have a similar design to the vertical contact structures 245*a*-245*e*.

In the examples of FIGS. 1A-1C, 2A-2C, 3A-3C, 4A-4B and 5A-5B, at least one vertical contact structure (e.g. 145*a*) is positioned outside a stack (e.g. 120) of layers and configured to electrically connect to a terminal layer (e.g. 121*a*) via a landing pad structure (e.g. 141*a*). As will be shown in FIGS. 6A-6D, at least one vertical contact structure may partially extend through a stack of layers. The at least one vertical contact structure includes a bottom surface in direct contact with a terminal layer and a side surface surrounded by a dielectric shell.

Figure 6A:
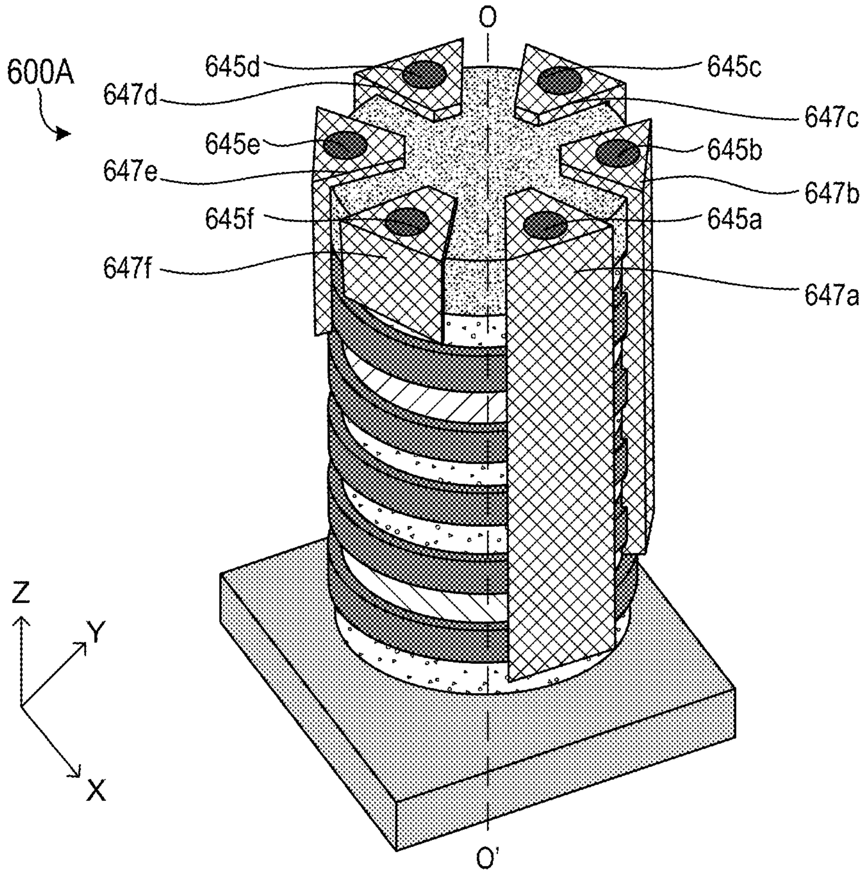
FIG. 6A shows a perspective view of a semiconductor device in accordance with yet another embodiment of the present disclosure.
Figure 6B:
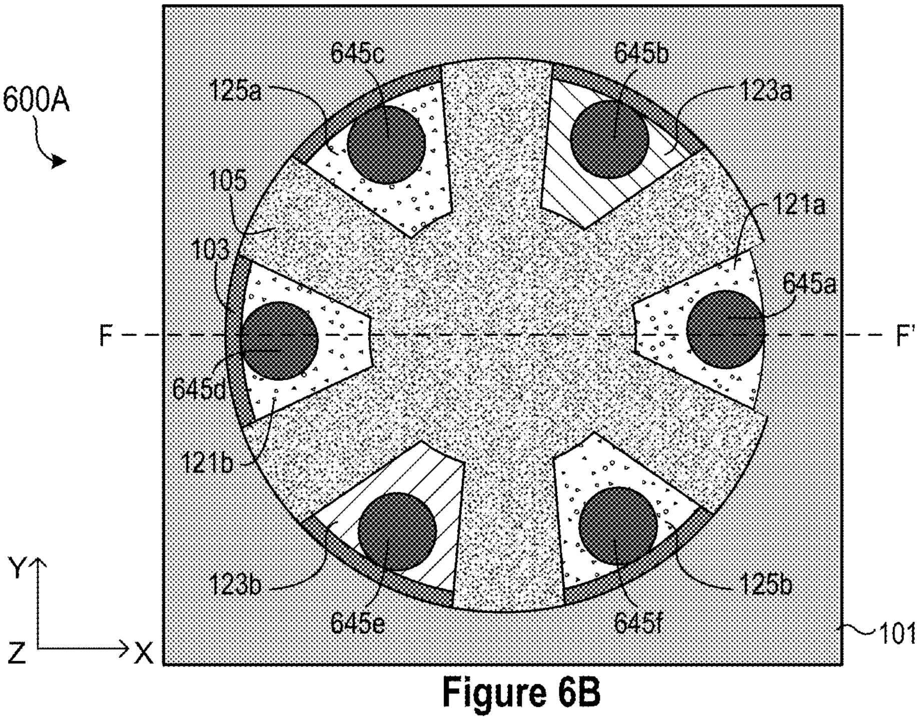
FIG. 6B shows a top view of the semiconductor device in FIG. 6A, in accordance with one embodiment of the present disclosure.
Figure 6C:
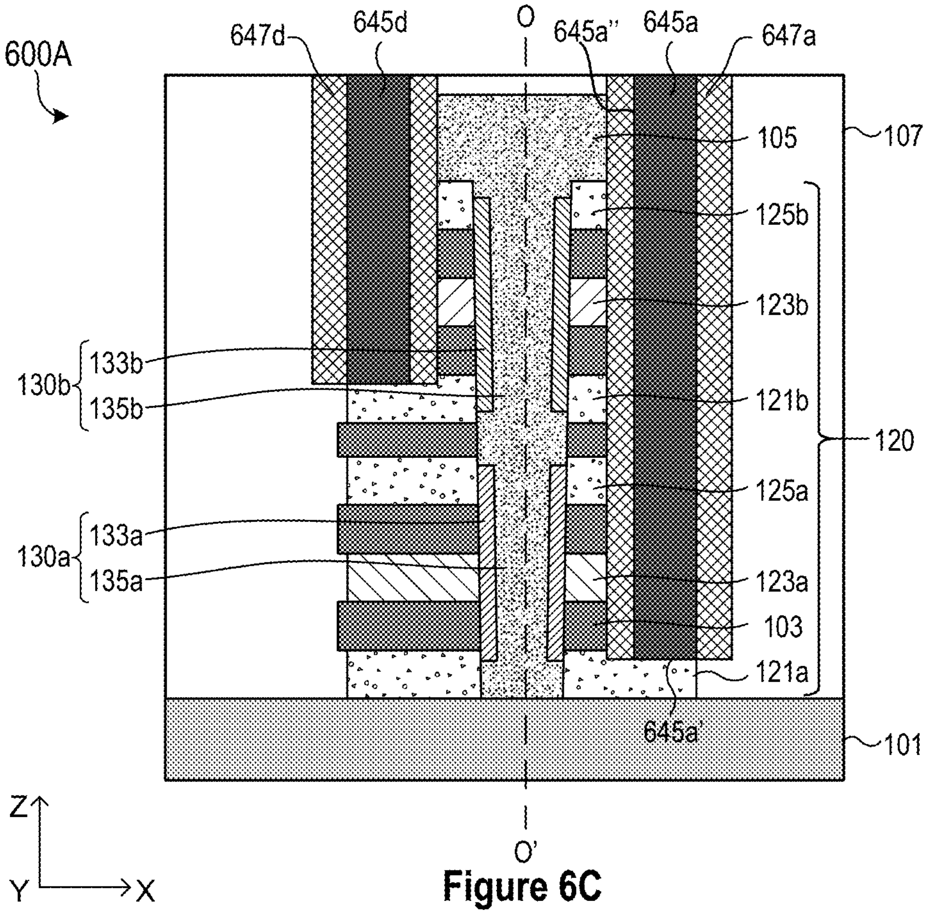
FIG. 6C shows a vertical cross-sectional view of taken along the line cut FF' in FIG. 6B, in accordance with one embodiment of the present disclosure.

FIG. 6A shows a perspective view of a semiconductor device 600A in accordance with yet another embodiment of the present disclosure. FIG. 6B shows a top view of the semiconductor device 600A in FIG. 6A, in accordance with one embodiment of the present disclosure. FIG. 6C shows a vertical cross-sectional view of taken along the line cut FF' in FIG. 6B, in accordance with one embodiment of the present disclosure. Since the embodiment of the semiconductor device 600A is similar to the embodiment of the semiconductor device 100, descriptions herein will be given with emphasis placed on differences.

As shown, the semiconductor device 600A includes vertical contact structures 645*a*, 645*b*, 645*c*, 645*d*, 645*e* and 645*f* and dielectric shells 647*a*, 647*b*, 647*c*, 647*d*, 647*e* and 647*f*. The vertical contact structures 645*a*-645*f* have different radial positions relative to the inner axis OO' and different lengths in the Z direction. Note that the vertical contact structures 645*a*-645*f* extend partially through the stack 120 of layers. Instead of being positioned outside the stack 120, the vertical contact structures 645*a*-647*f* can be positioned at least partially within the stack 120 or the sidewall surface 129.

Take the vertical contact structure 645*a* for example. The vertical contact structure 645*a* includes a bottom surface 645*a*' in direct contact with the S/D layer 121*a* and a side surface 645*a*" surrounded by a dielectric shell 647*a*. As a result, the vertical contact structure 645*a* can be electrically connected to the S/D layer 121*a* while being electrically isolated from other terminal layers of the stack 120. While the vertical contact structure 645*a* is shown to be positioned on a boundary of the stack 120, it should be understood that the vertical contact structure 645*a* can also be positioned away from or across the boundary of the stack 120. Note that no landing pad structure is needed because the vertical contact structure 645*a* and/or the dielectric shell 647*a* can be positioned partially or wholly within the stack 120.

Figure 6D:
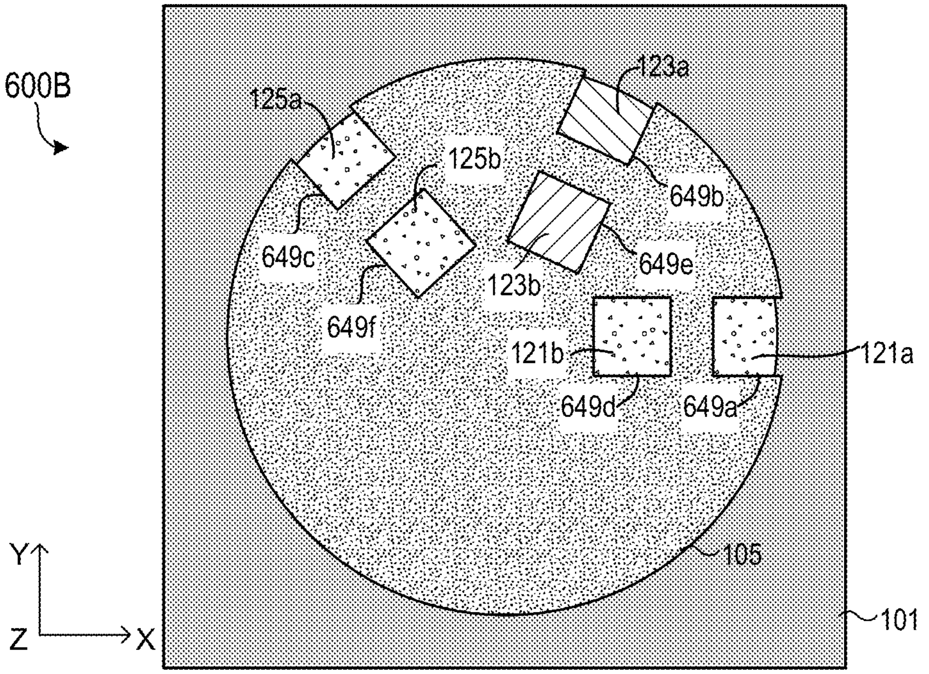
FIG. 6D shows a top view of a semiconductor device, in accordance with another embodiment of the present disclosure.

FIG. 6D shows a top view of a semiconductor device 600B, in accordance with another embodiment of the present disclosure. Since the embodiment of the semiconductor device 600B is similar to the embodiment of the semiconductor device 600A, descriptions herein will be given with emphasis placed on differences.

The semiconductor device 600B includes vertical contact structures (not shown) that are surrounded by dielectric shells (not shown) and positioned in holes 649*a*, 649*b*, 649*c*, 649*d*, 649*e* and 649*f*. At least two of the vertical contact structures are in a same radial position relative to the inner axis OO'. Specifically, two vertical contact structures that are positioned in the holes 649*a* and 649*d* are both in a first radial position. A vertical contact structure positioned in the hole 649*a* has a larger distance from the inner axis OO' than the vertical contact structure positioned in the hole 649*d*. Similarly, two vertical contact structures that are positioned in the holes 649*b* and 649*e* are both in a second radial position while two vertical contact structures that are positioned in the holes 649*c* and 649*f* are both in a third radial position.

Referring back to FIGS. 5A-5B, the vertical contact structure 545*g* extends along the inner axis OO' and is configured to electrically connect to the topmost terminal layer, i.e. the S/D layer 125*b*. Similarly, the semiconductor devices 600A and 600B may include a similar vertical contact structure in some embodiments. For example, the vertical contact structure 645*f* in FIGS. 6A-6C may be replaced by a vertical contact structure which extends along the inner axis OO' and is configured to electrically connect to the S/D layer 125*b*. For example in FIG. 6D, the hole 649*f* may not exist. Instead, the semiconductor device 600B includes a vertical contact structure that is similar to the vertical contact structure 545*g*.

Referring back to FIGS. 4A-4B, one or more interconnection structures can be configured to electrically connect a terminal layer of one stack to another terminal layer of another stack. It should be understood that such interconnection structures can also be applicable to structures in FIGS. 6A-6D.

Further, it should be understood that two vertical channel structurers (or vertical transistors) stacked in the Z direction are used for illustrative purposes in FIGS. 1A-1C, 2A-2C, 3A-3C, 4A-4B, 5A-5B and 6A-6D. Any number of terminal layers and vertical channel structurers (or vertical transistors) can be stacked in the Z direction. Similarly, only one stack of layers is used for illustrative purposes in FIGS. 1A-1C, 2A-2C, 3A-3C, 5A-5B and 6A-6D while two stacks of layers are used for illustrative purposes in FIGS. 4A-4B. Of course, any number of stacks of layers can be included.

Figure 7:
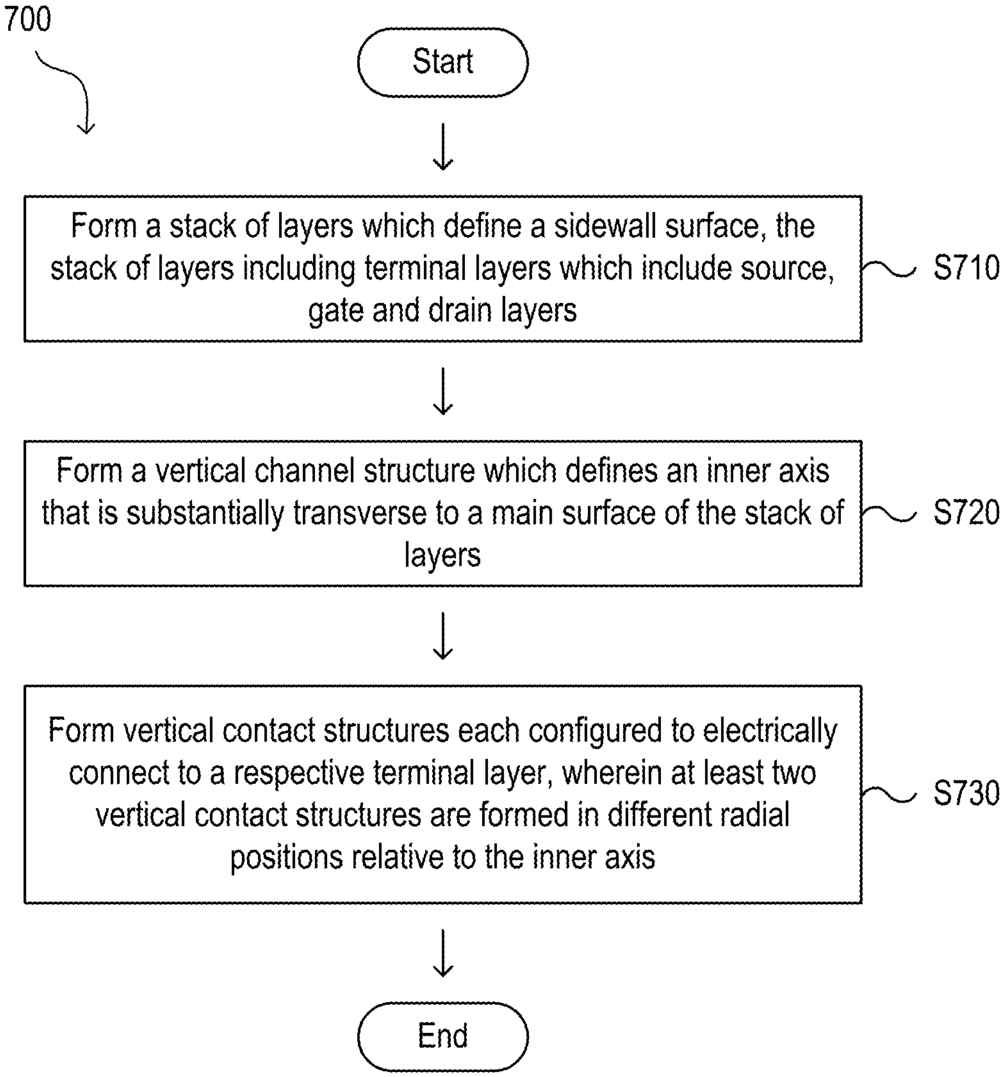
FIG. 7 shows a flow chart of a process for manufacturing a semiconductor device, in accordance with exemplary embodiments of the present disclosure.

FIG. 7 shows a flow chart of a process 700 for manufacturing a semiconductor device, such as the semiconductor devices 100, 200, 300, 400, 500, 600A, 600B and/or the like, in accordance with exemplary embodiments of the present disclosure. The process 700 starts with Step S710 by forming a stack of layers which define a sidewall surface. The stack of layers includes terminal layers which include source, gate and drain layers. For example, an initial stack of layers can be formed that includes dielectric layers and sacrificial layers. Subsequently, the initial stack of layers is directionally etched to define an initial sidewall surface and expose the sacrificial layers from the initial sidewall surface. The sacrificial layers are then replaced with the terminal layers to form the stack of layers.

At Step S720, a vertical channel structure is formed which defines an inner axis that is substantially transverse to a main surface of the stack of layers. For example, a first hole can be formed that extends through the initial stack of layers. Semiconductor layers are then formed in the first hole. The semiconductor layers include alternating replacement layers and channel layers. Next, a second hole is formed that extends through the semiconductor layers before the replacement layers are removed via the second hole. The second hole is filled with a dielectric material. The dielectric material and remaining portions of the channel layers can form vertical channel structures.

The process 700 then proceeds to Step S730 by forming vertical contact structures, each of which is configured to electrically connect to a respective terminal layer. At least two vertical contact structures are formed in different radial positions relative to the inner axis. In some embodiments, a landing pad structure is formed that extends outward from the stack of layers. A vertical contact structure can be formed on the landing pad structure. As a result, the landing pad structure is configured to electrically connect the vertical contact structure to a terminal layer of the stack of layers. In some embodiments, the stack of layers is directionally etched at least partially through to form a hole and expose a terminal layer. A dielectric shell and a vertical contact structure are then formed in the hole so that the vertical contact structure is surrounded by the dielectric shell and is in direct contact with the terminal layer. In some embodiments, a vertical contact structure may be formed that extends along the inner axis and is configured to electrically connect to a topmost terminal layer.

Figure 8A:
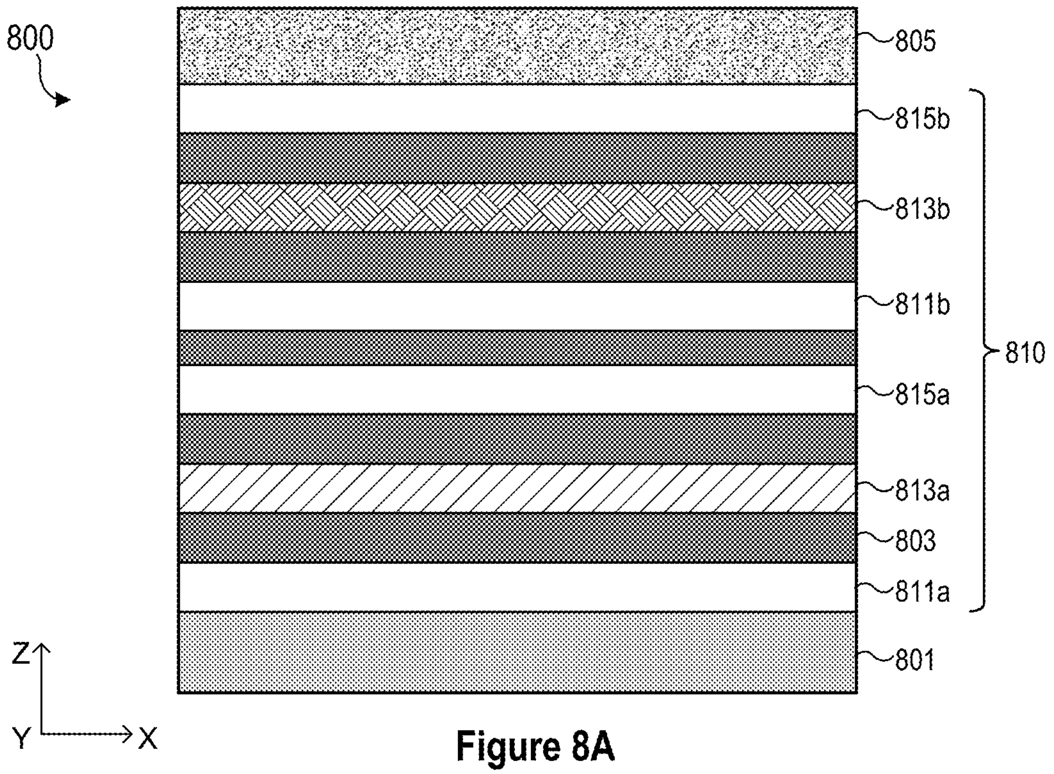
FIGS. 8A, 8B, 8C, 8D and 8E show vertical cross-sectional views of a semiconductor device at various intermediate steps of manufacturing, in accordance with exemplary embodiments of the present disclosure.
Figure 8B:
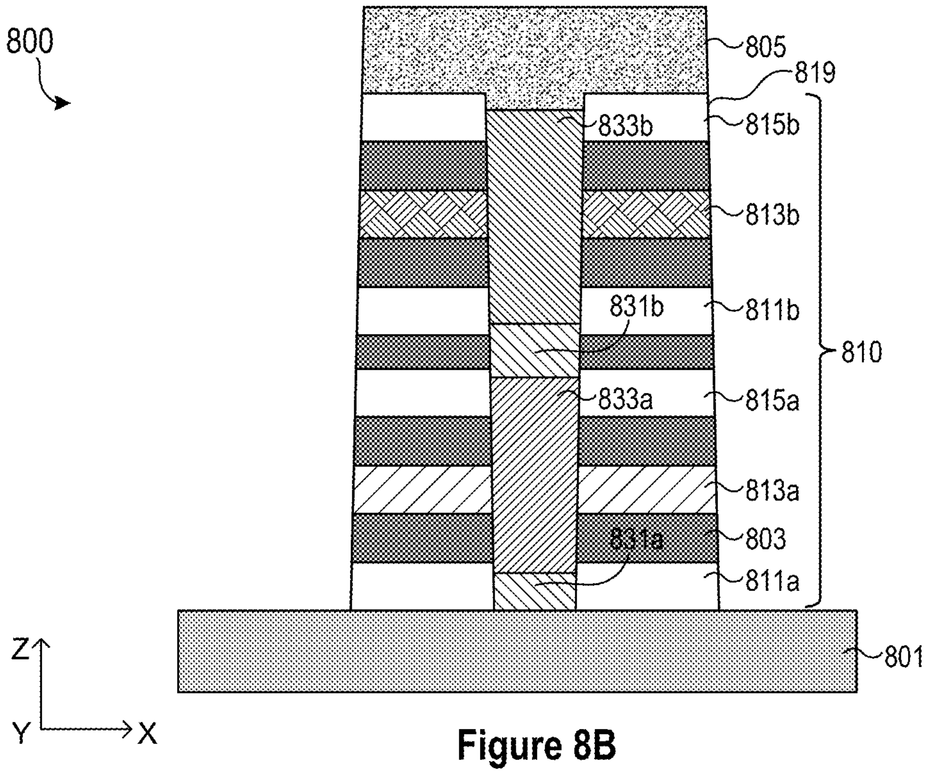
Figure 8B:
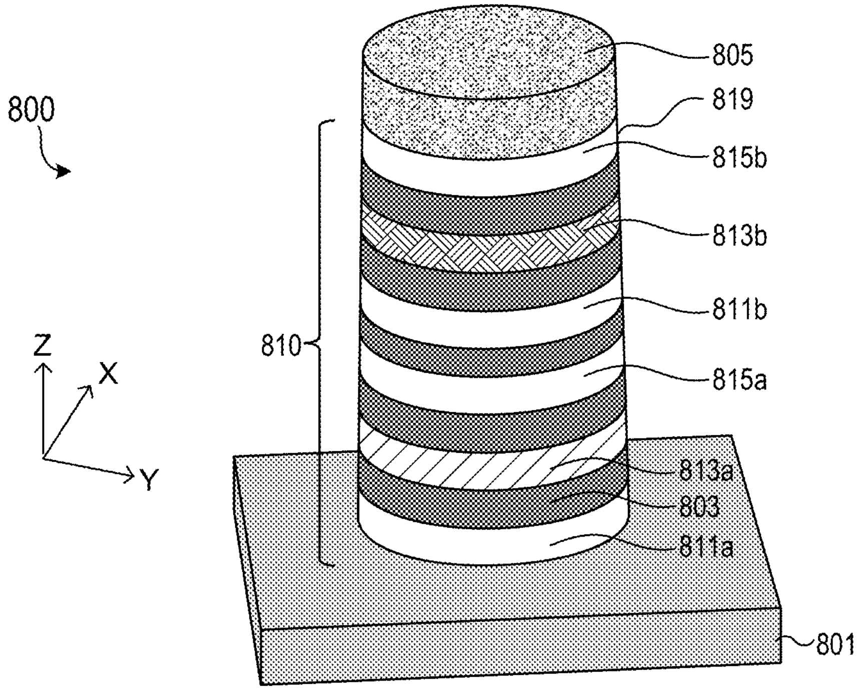

FIGS. 8A, 8B, 8C, 8D and 8E show vertical cross-sectional views of a semiconductor device 800 at various intermediate steps of manufacturing, in accordance with exemplary embodiments of the present disclosure. FIGS. 8B', 8D' and 8E' show perspective views of the semiconductor device 800 in FIGS. 8B, 8D and 8E respectively, in accordance with exemplary embodiments of the present disclosure.

As illustrated in FIG. 8A, the semiconductor device 800 includes an initial stack 810 of layers formed on a bottom semiconductor layer 801. The initial stack 810 of layers includes dielectric layers 803 and sacrificial layers stacked alternatingly over each other. In a non-limiting example, the sacrificial layers include first sacrificial layers 811*a*, 815*a*, 811*b* and 815*b*, a second sacrificial layer 813*a* and a third sacrificial layer 813*b*. The dielectric layers 803, the first sacrificial layers 811*a*, 815*a*, 811*b* and 815*b*, the second sacrificial layer 813*a* and the third sacrificial layer 813*b* are configured to be etch-selective to each other during subsequent processing. Further, a capping layer 805 may be formed over the initial stack 810 of layers. The bottom semiconductor layer 801, the dielectric layers 803 and the capping layer 805 can respectively correspond to the bottom semiconductor layer 101, the dielectric layers 103 and the capping layer 105.

In FIG. 8B, a first hole (not shown) is etched through the initial stack 810 of layers to expose the bottom semiconductor layer 801. Semiconductor layers can be formed in the first hole. The semiconductor layers include alternating replacement layers 831*a* and 831*b* and channel layers 833*a* and 833*b*. Then, the initial stack 810 of layers is directionally etched to define an initial sidewall surface 819 and expose the sacrificial layers from the initial sidewall surface 819.

In some embodiments, the semiconductor layers are epitaxially grown on the bottom semiconductor layer 101. In a non-limiting example, the replacement layers 831*a* and 831*b* include silicon-germanium (SiGe). The channel layers 833*a* and 833*b* respectively include n-type Si and p-type Si. “Epitaxial growth”, “epitaxial deposition”, “epitaxially grown”, “epitaxially formed” or “epitaxy” as used herein generally refers to a type of crystal growth or material deposition in which a crystalline layer is formed over a seed layer that is crystalline. Crystalline characteristics (e.g. crystal orientation) of the crystalline layer are related to or dictated by crystalline characteristics of the seed layer. Particularly, a semiconductor material can be epitaxially grown on a surface of another semiconductor layer that is crystalline. In some embodiments, epitaxial growth can be selective such that a semiconductor material may only be epitaxially grown on another semiconductor surface and generally do not deposit on exposed surfaces of non-semiconductor materials, such as silicon oxide, silicon nitride, and the like. Epitaxial growth can be accomplished by molecular beam epitaxy, vapor-phase epitaxy, liquid-phase epitaxy, or the like. Si, SiGe, Ge and other semiconductor materials can be doped during epitaxial growth (in situ) by addition of dopants. For example in vapor-phase epitaxy, a dopant vapor can be added to the gas source. Further, in some embodiments, the semiconductor layers can include one or more 2D semiconductor materials, such as a metal chalcogenide, a carbon-based material (e.g. graphene), a semiconducting oxide (e.g. ZnO, CdO or $In_2O_3$), hexagonal boron nitride (h-BN) or the like. For example, a metal chalcogenide may include at least one of $WS_2$, $WSe_2$, $WTe_2$, $MoS_2$, $MoSe_2$, $MoTe_2$, $HfS_2$, $ZrS_2$, $TiS_2$, GaSe, InSe, SnS, $TiS_3$ or the like. Accordingly, the semiconductor layers need not be formed by epitaxial growth and thus can be formed on a dielectric layer or a dielectric substrate.

In the examples of FIGS. 8B and 8B', the initial stack 810 is cylindrical and has a circular shape in a plane (e.g. the XY plane) parallel to a main surface of the initial stack 810 of layers. It should be understood that the initial stack 810 may be directionally etched to have any shape as long as the sacrificial layers are exposed from 360 degrees. Further, the initial stack 810 may be directionally etched to have any number of independent stacks of layers.

Figure 8C:
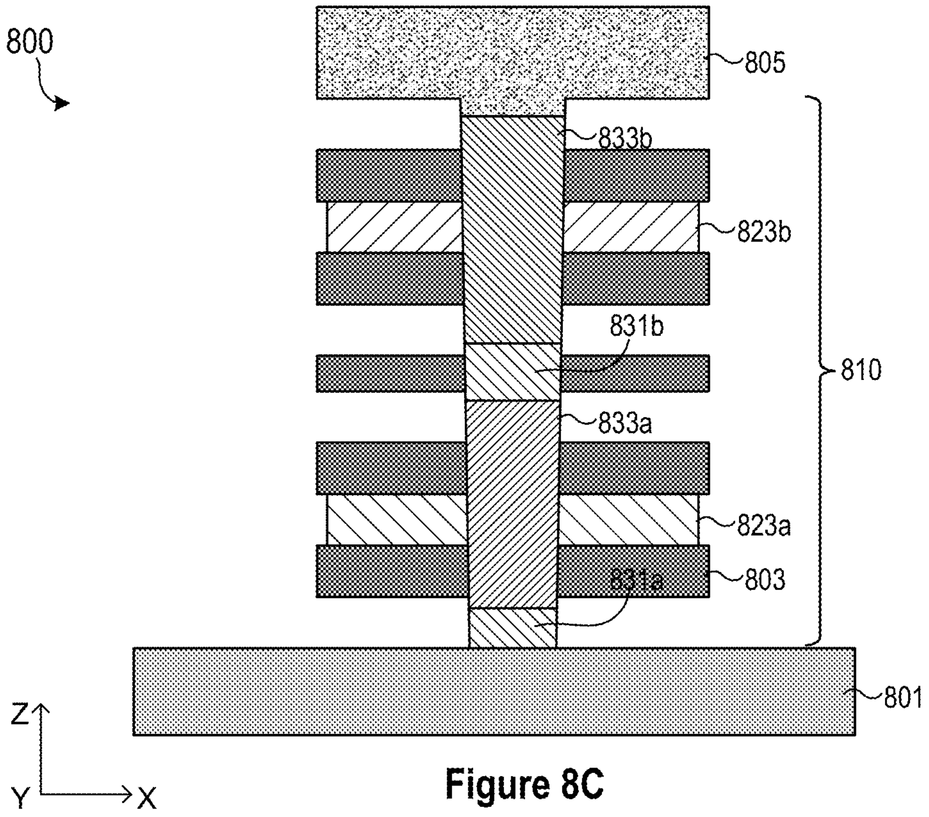

Subsequently, the sacrificial layers are replaced with terminal layers. In a non-limiting example, the second sacrificial layer 813*a* is selectively etched away and replaced with a gate layer 823*a*. Then, the third sacrificial layer 813*b* is selectively etched away and replaced with a gate layer 823*b*. Next, the first sacrificial layers 811*a*, 815*a*, 811*b* and 815*b* are etched away as shown in FIG. 8C, before S/D layers 821*a*, 825*a*, 821*b* and 825*b* are formed. As a result, a stack 820 of layers is formed that defines a sidewall surface 829. Herein, the S/D layers 821*a*, 825*a*, 821*b* and 825*b* can respectively correspond to the S/D layers 121*a*, 125*a*, 121*b* and 125*b*. The gate layers 823*a* and 823*b* can respectively correspond to the gate layers 123*a* and 123*b*.

While not shown, in some embodiments, the second sacrificial layer 813*a* can be replaced with the gate layer 823*a* in a few steps. First, the second sacrificial layer 813*a* is selectively etched away. The channel layer 833*a* is thus exposed. Second, a high-k dielectric (not shown) can be selectively formed on silicon surfaces, including the channel layer 833*a* and the bottom semiconductor layer 801. Third, a WFM (not shown) can be selectively deposited on the high-k dielectric. Fourth, a directional etching process is executed to remove the WFM from the bottom semiconductor layer 801, followed by a short or quick isotropic etching process to remove the WFM deposited on unintentional surfaces. As a result, the WFM remains only where the second sacrificial layer 813*a* has been etched away. The high-k dielectric deposited on the bottom semiconductor layer 801 is eventually removed.

The third sacrificial layer 813*b* can be replaced with the gate layer 823*b* in similar steps. The first sacrificial layers

811_a_, 815_a_, 811_b_ and 815_b_ can be replaced with the S/D layers 821_a_, 825_a_, 821_b_ and 825_b_ in similar steps, except that no high-k dielectric is needed. Conductive layers, such as metallic layers, are selectively formed directly on exposed surfaces of the channel layers 833_b_ and 833_a_. A directional etching process as well as a short or quick isotropic etching process can also be executed to remove the conductive layers deposited on unintentional surfaces. Note that in the examples of 8C, 8D and 8D', the sidewall surface 829 has a staggered profile, which can be caused by a corresponding deposition process and/or a corresponding isotropic etching process. As a result, the dielectric layers 803 have larger dimensions than the terminal layers in the XY plane. In other examples (not shown), the sidewall surface 829 can have a flat or smooth profile. The dielectric layers 803 and the terminals layers may have identical dimensions in the XY plane.

Note that the sacrificial layers can be replaced with the terminal layers by other lithographic processes and/or in a different sequence. For example, the first sacrificial layers 811_a_, 815_a_, 811_b_ and 815_b_ can be replaced before the gate layers 813_a_ and 813_b_ are replaced. Additionally, the first sacrificial layers 811_a_, 815_a_, 811_b_ and 815_b_ may be chemically different, or rather etch-selective to each other. The S/D layers 821_a_, 825_a_, 821_b_ and 825_b_ may thus be formed separately and include different conductive materials.

Figure 8D:
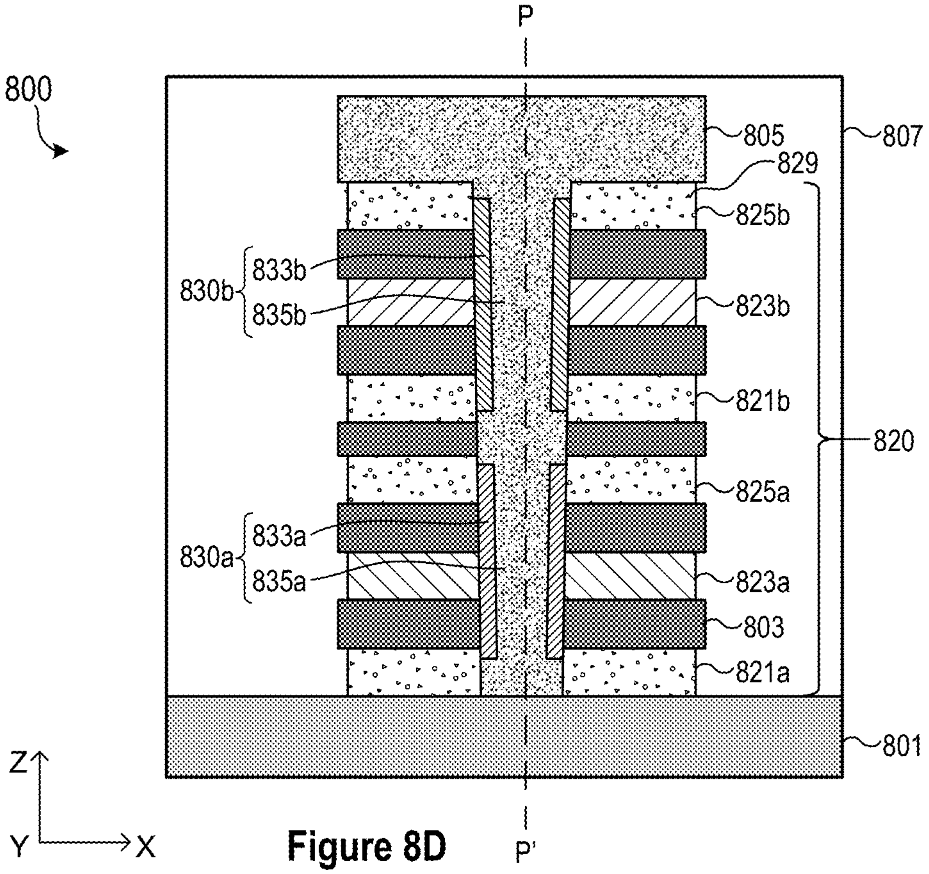
Figure 8D:
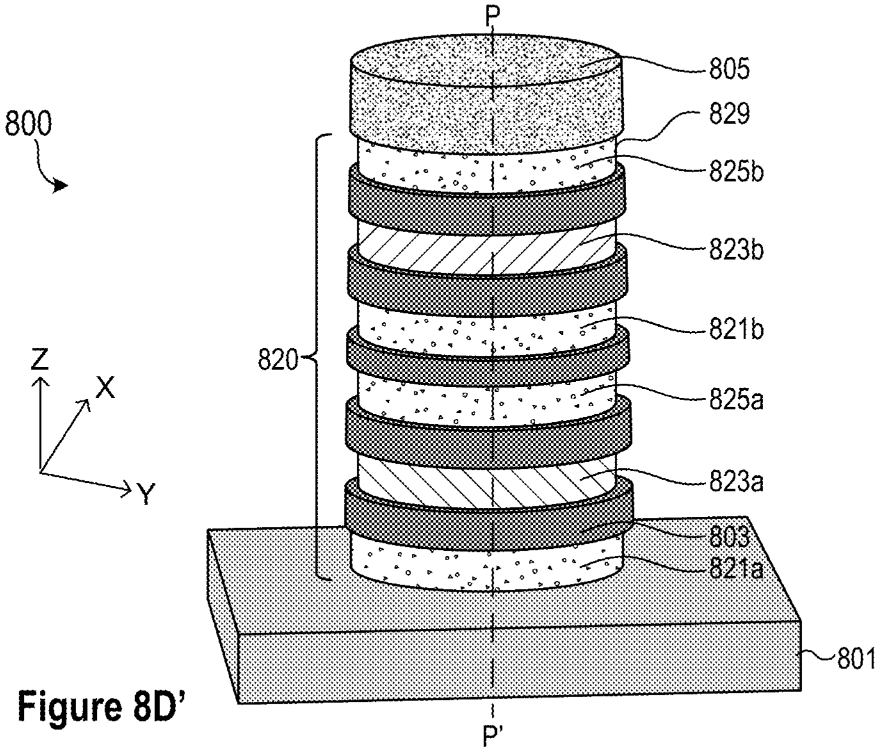

In FIGS. 8D and 8D', a second hole (not shown) is etched through the semiconductor layers, including the replacement layers 831_a_ and 831_b_ as well as the channel layers 833_a_ and 833_b_. The bottom semiconductor layer 801 is consequently exposed. Note that the second hole has a smaller diameter than the first hole in order that the replacement layers 831_a_ and 831_b_ as well as the channel layers 833_a_ and 833_b_ are not completely removed yet.

Then, the replacement layers 831_a_ and 831_b_ are completely removed via the second hole before the second hole is filled with a dielectric material, such as the capping layer 805. As a result, vertical channel structures 830_a_ and 830_b_ are formed that define an inner axis PP'. For example, the vertical channel structure 830_a_ include a remaining portion of the channel layer 833_a_ (also referred to as a semiconductor shell) surrounding a dielectric core 835_a_. Next, an insulating layer 807 is formed over the stack 820 of layers and surrounds the stack 820 of layers.

Herein, the vertical channel structures 830_a_ and 830_b_ can respectively correspond to the vertical channel structures 130_a_ and 130_b_. The inner axis PP' can correspond to the inner axis OO'. Semiconductor shells 833_a_ and 833_b_ can respectively correspond to the semiconductor shells 133_a_ and 133_b_. Dielectric cores 835_a_ and 835_b_ can respectively correspond to the dielectric cores 135_a_ and 135_b_. The stack 820 of layers can correspond to the stack 120 of layers. The insulating layer 807 can correspond to the insulating layer 107.

Note that the semiconductor device 800 in FIGS. 8D and 8D' can go through further processing steps to form the semiconductor device 100, 200, 300, 400, 500, 600A, 600B or the like.

Figure 8E:
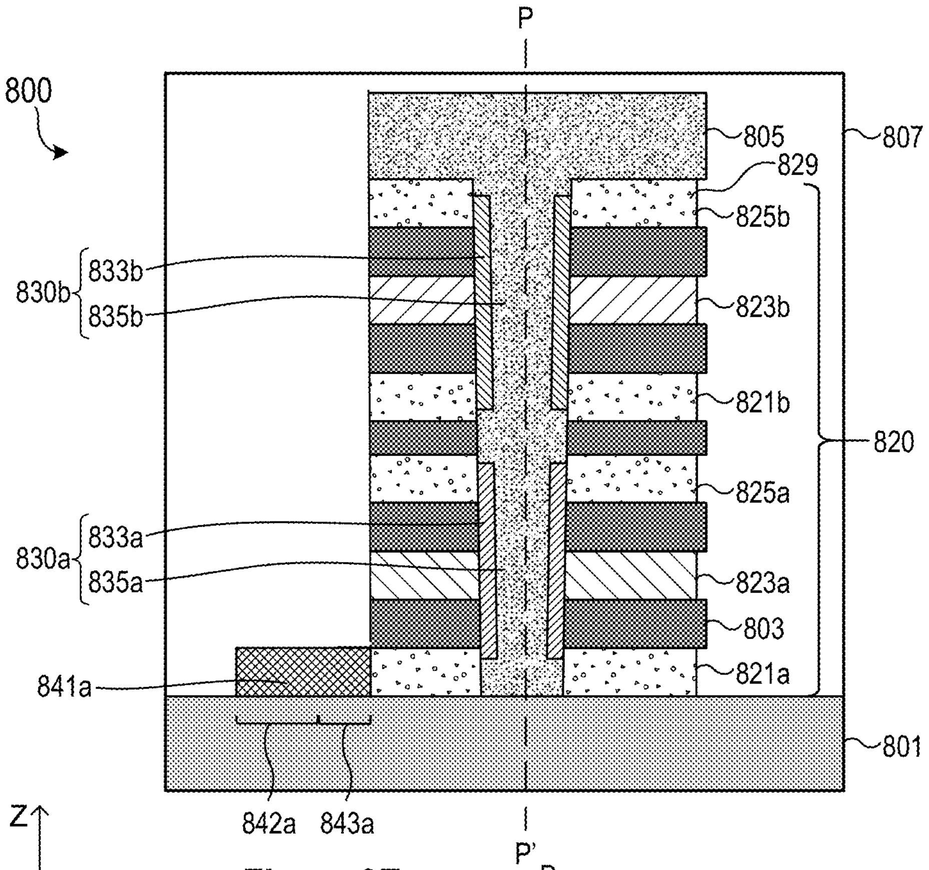
Figure 8E:
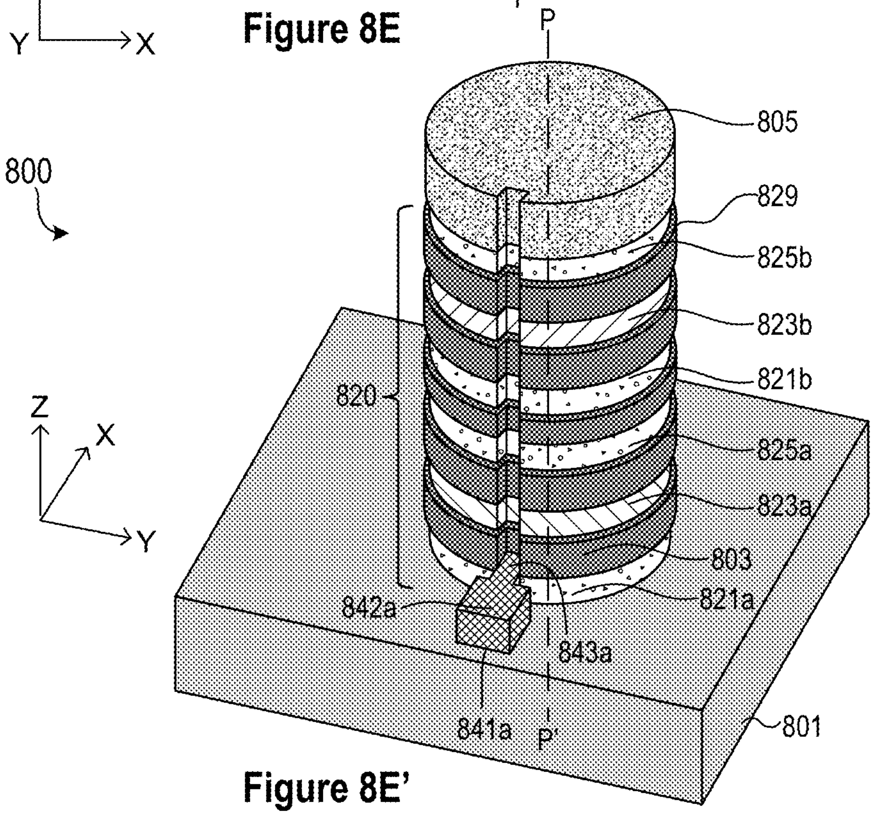

In some embodiments, a landing pad structure 841_a_ that extends outward from the stack 820 of layers is formed, as shown in FIGS. 8E and 8E'. Specifically, a first contact hole (not shown) is etched through the stack 820 of layers and the insulating layer 807. The first contact hole exposes the S/D layer 821_a_ and the bottom semiconductor layer 801. A conductive material is then deposited to fill the first contact hole and may form an overburden which can be removed by chemical-mechanical polishing (CMP). The conductive material is subsequently etched back or recessed to below the gate layer 823_a_ in order that the (remaining) conductive material is electrically connected to the S/D layer 821_a_ while spaced apart from other terminal layers and thus forms the landing pad structure 841_a_. Then, the first contact hole is filled with a dielectric material, such as the insulating layer 807. Note that the landing pad structure 841_a_ can correspond to the landing pad structure 141_a_, 241_a_, 341_a_, 441_a__1 or 541_a_.

In one embodiment, a semiconductor device that corresponds to the semiconductor device 100 in FIGS. 1A-1C is formed. Specifically, another five landing pad structures that correspond to the landing pad structures 141_b_-141_f_ can be formed. Then, a selective etching process can be executed to stop at and expose pad portions of the (six) landing pad structures. Next, six vertical contact structures that correspond to the vertical contact structures 145_a_-145_f_ are formed on the pad portions of the landing pad structures.

In another embodiment, a semiconductor device that corresponds to the semiconductor device 200 in FIGS. 2A-2C is formed. Specifically, after the landing pad structure 841_a_ is formed, another five landing pad structures are formed that correspond to the landing pad structures 241_b_-241_f_ Then, a selective etching step is executed partially above the (six) landing pad structures to define six holes, each of which includes a respective shallow portion that exposes a respective landing pad structure and a respective deep portion that bypasses the respective landing pad structure in the Z direction. The selective etching step is configured to selectively etch the insulating layer 807 while leaving the landing pad structures unetched or etched slightly. Hence, shallow portions are formed because the selective etching step stops or slows down at the landing pad structures whereas deep portions have a same depth in the Z direction. Note that the six holes are formed simultaneously by the selective etching step. Subsequently, a conductive material can be deposited to fill the six holes to form six vertical contact structures that correspond to the vertical contact structures 245_a_-245_f_ A CMP step may be executed to remove any overburden of the conductive material over the insulating layer 807.

Alternatively, the selective etching step can be replaced with a non-selective etching step, which etches the landing pad structures and the insulating layer 807 although etching rates may differ. As a result, vertical contact structures are formed, each of which may bypass a respective landing pad structure. In other words, a given vertical contact structure is in direct contact with a respective landing pad structure from a side surface of the respective landing pad structure.

In yet another embodiment, a semiconductor device that corresponds to the semiconductor device 300 in FIGS. 3A-3C is formed. Specifically, after the landing pad structure 841_a_ is formed, another landing pad structure, which corresponds to the landing pad structure 341_e_, is formed in a same radial position relative to the inner axis PP' as the landing pad structure 841_a_. Then, four more landing pad structures, which correspond to the landing pad structure 341_b_, 341_c_, 341_d_ and 341_f_, are formed in another two radial positions relative to the inner axis PP'. Subsequently, six vertical contact structures that correspond to the vertical contact structures 345_a_-345_f_ can be formed, for example by a selective etching step, a deposition step and a CMP step, similar to previous descriptions.

In yet another embodiment, a semiconductor device that corresponds to the semiconductor device 400 in FIGS. 4A-4B is formed. As has been mentioned in FIG. 8B, the initial stack 810 may be directionally etched to have any number of independent stacks of layers. Herein, at least two stacks of layers, which are similar to the stack 820 of layers, can be formed. Landing pad structures and vertical contact structures of the at least two stacks of layers can be formed using processes described earlier.

In order to form an interconnection structure that corresponds to the interconnection structure 451, a directional etching process is executed to form an interconnection hole that exposes two corresponding gate layers of two stacks of layers. A conductive material is deposited in the interconnection hole before being etched back or recessed to form the interconnection structure. As a result, the interconnection structure extends outward from the two stacks of layers and electrically connects the two corresponding gate layers. Similarly, more interconnection structures can be formed, each of which is configured to electrically connect a terminal layer of one stack of layers to another terminal layer of another stack of layers.

In yet another embodiment, a semiconductor device that corresponds to the semiconductor device 500 in FIGS. 5A-5C is formed. Specifically, five vertical contact structures that correspond to the vertical contact structures 545*a*-545*e* and five landing structures that correspond to the landing structures 541*a*-541*e* can be formed using processes described earlier.

In order to form a sixth vertical contact structure that corresponds to the vertical contact structure 545*g*, a top hole (not shown) can be directionally etched through the insulating layer 807 to expose a topmost terminal layer, i.e. the S/D layer 825*b*, without exposing the vertical channel structure 830*b* underneath. A conductive material is then deposited to fill the top hole and form the sixth vertical contact structure. As a result, the sixth vertical contact structure can be in direct contact with the S/D layer 825*b*.

In yet another embodiment, a semiconductor device that corresponds to the semiconductor device 600A in FIGS. 6A-6C is formed. Referring back to FIGS. 8D and 8D', no landing pad structure needs to be formed. Instead, a hole (not shown) is etched at least partially through the stack 820 of layers and exposes a terminal layer of the stack 820 of layers before being filled with a dielectric material. Similarly, five more holes (not shown) can be individually formed to expose five more terminal layers of the stack 820 of layers before being filled with the dielectric material. Subsequently, a selective etching process can be executed to etch through the dielectric material and expose each terminal layer, thus forming a respective contact hole (not shown) on each terminal layer. Each contact hole is surrounded by a respective remaining portion of the dielectric material, which forms a respective dielectric shell. Contact holes are filled with a conductive material to form vertical contact structures that correspond to the vertical contact structures 645*a*-645*f* Because no landing pad structure is formed, the number of processing steps can be reduced.

In yet another embodiment, a semiconductor device that corresponds to the semiconductor device 600B in FIG. 6D is formed. Similarly, six holes (not shown) can be formed to expose six terminal layers of the stack 820 and filled with a dielectric material. However, the six holes correspond to the holes 649*a*-649*f* and are formed in three radial positions relative to the inner axis PP', with every two holes arranged in a same radial position. Six contact holes (not shown) can then be etched through the dielectric material in the six holes and filled with vertical contact structures.

Further, it should be understood that two vertical channel structurers (or vertical transistors) stacked in the Z direction are used for illustrative purposes in FIGS. 8A-8E, 8B', 8D' and 8E'. Any number of terminal layers and vertical channel structurers (or vertical transistors) can be formed and stacked in the Z direction. Similarly, only one stack of layers is used for illustrative purposes in FIGS. 8A-8E, 8B', 8D' and 8E'. Of course, any number of stacks of layers can be formed.

In one example, at least two vertical contact structures are formed with different distances from the inner axis PP'. In another example, at least two vertical contact structures are formed with a same distance from the inner axis PP'. In one example, at least two vertical contact structures are formed in a same radial direction relative to the inner axis PP'. In another example, at least two vertical contact structures are formed in different radial directions relative to the inner axis PP'.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:

a stack of layers defining a sidewall surface, the stack of layers including terminal layers which include source, gate and drain layers;

a vertical channel structure defining an inner axis that is substantially transverse to a main surface of the stack of layers, wherein the vertical channel structure includes a semiconductor shell surrounding a dielectric core; and vertical contact structures each configured to electrically connect to a respective terminal layer, wherein at least two vertical contact structures are in different radial positions relative to the inner axis.

2. The semiconductor device of claim 1, wherein:

at least one vertical contact structure is positioned outside the stack of layers.

3. The semiconductor device of claim 2, further comprising:

a landing pad structure extending from the stack of layers outward to the at least one vertical contact structure, the landing pad structure configured to electrically connect the at least one vertical contact structure to a respective terminal layer.

4. The semiconductor device of claim 3, wherein:

the at least one vertical contact structure is partially positioned on the landing pad structure and partially bypasses and extends beyond the landing pad structure in a direction of the inner axis.

5. The semiconductor device of claim 3, wherein:

the at least one vertical contact structure is positioned on the landing pad structure.

6. The semiconductor device of claim 1, wherein:

at least one vertical contact structure partially extends through the stack of layers.

7. The semiconductor device of claim 6, wherein:

the at least one vertical contact structure includes a bottom surface in direct contact with a terminal layer.

8. The semiconductor device of claim 7, further comprising:

a dielectric shell surrounding a side surface of the at least one vertical contact structure.

9. The semiconductor device of claim 1, further comprising:

at least one vertical contact structure which extends along the inner axis and is configured to electrically connect to a topmost terminal layer.

10. The semiconductor device of claim 1, further comprising:

an interconnection structure configured to electrically connect a terminal layer of the stack of layers to another terminal layer of another stack of layers.

11. The semiconductor device of claim 10, wherein:

at least one vertical contact structure is positioned on the interconnection structure.

12. The semiconductor device of claim 1, wherein:

at least two vertical contact structures are in a same radial position relative to the inner axis.

13. The semiconductor device of claim 1, wherein:

at least two vertical contact structures have a same distance from the inner axis.

14. The semiconductor device of claim 1, wherein:

at least two vertical contact structures have different distances from the inner axis.

15. The semiconductor device of claim 1, wherein:

the vertical channel structure extends from a source layer, through a gate layer, to a drain layer.

16. The semiconductor device of claim 1, wherein:

the vertical channel structure is configured to include a source region, a channel region and a drain region serially connected in a direction of the inner axis and have a current flow path in the direction of the inner axis.

17. The semiconductor device of claim 1, wherein:

a portion of the vertical channel structure is surrounded by a gate layer.

18. The semiconductor device of claim 1, wherein:

the stack of layers includes alternating dielectric layers and the terminal layers.

19. The semiconductor device of claim 1, further comprising:

a bottom semiconductor layer positioned below the stack of layers.

20. A semiconductor device, comprising:

a stack of layers defining a sidewall surface, the stack of layers including terminal layers which include source, gate and drain layers;

a vertical channel structure defining an inner axis that is substantially transverse to a main surface of the stack of layers;

vertical contact structures each configured to electrically connect to a respective terminal layer; and a landing pad structure extending from the stack of layers outward to the at least one vertical contact structure, the landing pad structure configured to electrically connect the at least one vertical contact structure to a respective terminal layer, wherein at least two vertical contact structures are in different radial positions relative to the inner axis, at least one vertical contact structure is positioned outside the stack of layers, the at least one vertical contact structure is partially positioned on the landing pad structure and partially bypasses the landing pad structure in a direction of the inner axis, at least two vertical contact structures have a same length in the direction of the inner axis, and the at least two respective landing pad structures are in different radial positions and different longitudinal positions relative to the inner axis.

* * * * *